(12) United States Patent
Zopf

(10) Patent No.: US 8,938,663 B2
(45) Date of Patent: Jan. 20, 2015

(54) MODEM ARCHITECTURE FOR JOINT SOURCE CHANNEL DECODING

(71) Applicant: Broadcom Corporation, Irvine, CA (US)

(72) Inventor: Robert W. Zopf, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 69 days.

(21) Appl. No.: 13/749,064

(22) Filed: Jan. 24, 2013

(65) Prior Publication Data

US 2013/0191706 A1  Jul. 25, 2013

Related U.S. Application Data

(60) Provisional application No. 61/753,560, filed on Jan. 17, 2013, provisional application No. 61/706,328, filed on Sep. 27, 2012, provisional application No. 61/590,015, filed on Jan. 24, 2012.

(51) Int. Cl.

| | | |
|---|---|---|
| *H03M 13/00* | (2006.01) | |
| *G06F 11/08* | (2006.01) | |
| *H03M 13/29* | (2006.01) | |
| *H04L 1/00* | (2006.01) | |
| *H04L 1/18* | (2006.01) | |

(52) U.S. Cl.
CPC ............... *G06F 11/08* (2013.01); *H03M 13/29* (2013.01); *H03M 13/2957* (2013.01); *H04L 1/0045* (2013.01); *H04L 1/0014* (2013.01); *H04L 1/005* (2013.01); *H04L 1/0055* (2013.01); *H04L 1/1845* (2013.01)
USPC ............................ 714/780; 714/755; 714/758

(58) Field of Classification Search
CPC ........................... H03M 13/2957; G06F 11/08
USPC ............................................ 714/755, 758, 780
See application file for complete search history.

(56) References Cited

U.S. PATENT DOCUMENTS

| | | | | |
|---|---|---|---|---|
| 5,838,267 | A * | 11/1998 | Wang et al. | 341/94 |
| 6,557,139 | B2 * | 4/2003 | Bohnke | 714/758 |
| 6,625,775 | B1 | 9/2003 | Kim | |
| 6,731,700 | B1 * | 5/2004 | Yakhnich et al. | 375/341 |
| 6,826,235 | B2 * | 11/2004 | Raphaeli et al. | 375/262 |
| 8,214,727 | B2 * | 7/2012 | Kang et al. | 714/786 |
| 8,225,167 | B2 * | 7/2012 | Choi et al. | 714/752 |
| 8,660,167 | B2 * | 2/2014 | Wehinger | 375/147 |
| 2002/0166092 | A1 | 11/2002 | Kyosti et al. | |
| 2004/0240590 | A1 | 12/2004 | Cameron et al. | |
| 2006/0203943 | A1 | 9/2006 | Scheim et al. | |
| 2010/0115373 | A1 | 5/2010 | Calvanese Strinati et al. | |
| 2010/0281089 | A1 | 11/2010 | Vigoda et al. | |
| 2011/0087944 | A1 | 4/2011 | Li et al. | |
| 2013/0188758 | A1 | 7/2013 | Zopf | |
| 2013/0191120 | A1 | 7/2013 | Zopf et al. | |
| 2013/0191707 | A1 | 7/2013 | Zopf | |

* cited by examiner

*Primary Examiner* — Esaw Abraham
(74) *Attorney, Agent, or Firm* — Fiala & Weaver P.L.L.C.

(57) ABSTRACT

A modem architecture that supports the application of joint source channel decoding (JSCD). The modem architecture includes two channel decoders, one of which is modified to provide improved signal quality. The modem architecture further includes transparent network layers that enable the passage of data from one layer to another layer. For example, the modem architecture enables the passage soft bits, when available, from a physical layer to an application layer. The soft bits may be utilized for JSCD, packet loss concealment, or other applications. The modem architecture enables encryption and decryption of data to incorporate extrinsic information in operating JSCD.

20 Claims, 11 Drawing Sheets receive a cipher stream configured to decrypt and/or encrypt the first hard bits, the first soft bits, the second hard bits, and the second soft bits /702
FIG. 7
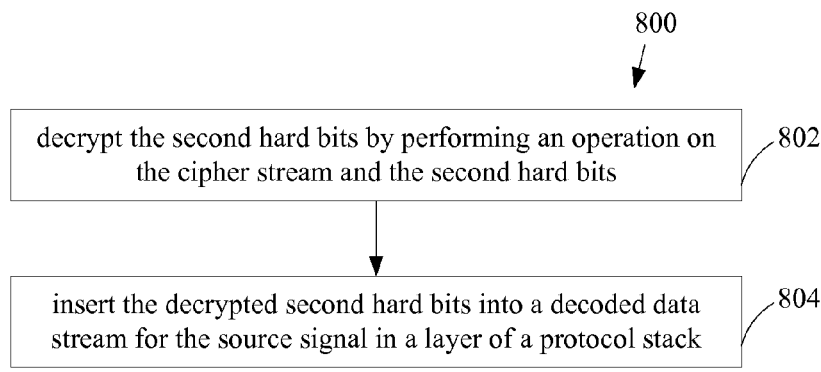
FIG. 8
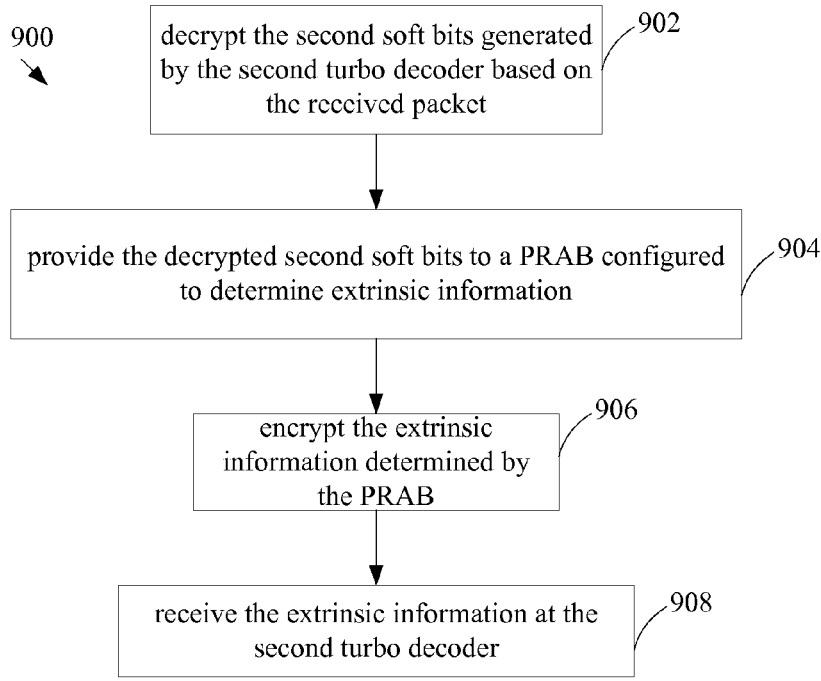
FIG. 9

MODEM ARCHITECTURE FOR JOINT SOURCE CHANNEL DECODING

CROSS REFERENCE TO RELATED APPLICATION

This application claims priority to the following provisional applications, each of which is incorporated by reference herein: U.S. Provisional Patent Application No. 61/590,015, filed Jan. 24, 2012, U.S. Provisional Patent Application No. 61/706,328, filed Sep. 27, 2012, and U.S. Provisional Patent Application No. 61/753,560, filed Jan. 17, 2013.

This application is also related to the following U.S. patent applications, each of which also claims the benefit of U.S. Provisional Patent Application Nos. 61/590,015 and 61/706,328, and each of which is incorporated by reference herein:

U.S. patent application Ser. No. 13/748,904, filed on even date herewith and entitled "Joint Source Channel Decoding Using Parameter Domain Correlation";

U.S. patent application Ser. No. 13/749,187, filed on even date herewith and entitled "Modified Joint Source Channel Decoder"; and U.S. patent application Ser. No. 13/748,949, filed on even date herewith and entitled "Constrained Soft Decision Packet Loss Concealment."

BACKGROUND

1. Technical Field

The subject matter described herein relates to a modem architecture that supports joint source channel decoding (JSCD).

2. Description of Related Art

Various communication standards exist for enabling wireless voice calls and high-speed data communications using mobile devices. For instance, Long Term Evolution (LTE) is a standard for wireless data communications, and is an evolution of the Universal Mobile Telecommunications System (UTMS) and Global System for Mobile Communications (GSM) standards. LTE is referred as a fourth generation (4G) mobile communication standard, and is a successor to third generation (3G) (e.g., UTMS) and second generation (2G) (e.g., GSM) mobile communication standards. In legacy 2G and 3G mobile telecommunications systems, voice calls are circuit-switched. In contrast, LTE enables voice calls to be made in a packet-switched manner over IP (Internet protocol), which is referred to as "VoLTE" (voice over LTE), and is supported by the IP Multimedia Subsystem (IMS). Thus, as LTE becomes more widespread, communication devices and voice call networks will need to be reengineered to handle the VoLTE voice calls.

Communication systems that implement one or more of these communication standards to exchange data may encode the data at a transmitting end and decode the data at a receiving end. An encoder may be used to encode the data, and a decoder may be used to decode the data. Implementations of encoder/decoder pairs can be used in a wide range of communication systems and devices, such as mobile devices, desktop computers and servers, computer networks, telecommunication networks, and the like. The encoding and decoding of the transmitted data may allow for increased data integrity, security of the data, compression of the data, etc.

When decoding data that was received over a communication channel, a decoder may attempt to model the received data in order to determine if errors exist. Different types of decoders may model data in different ways based on how the data was encoded. For example, a turbo decoder is a type of decoder that may be used in a device to decode received data and model the data to determine errors. A turbo decoder may include a pair of sub-decoders that work cooperatively to refine and improve the estimate of the original information bits received in a data packet.

LTE has several built-in mechanisms that may be leveraged by decoders to improve performance in adverse channel conditions, including retransmissions, code rate adjustments, and modulation scheme alterations. For instance, improved performance can be obtained by using an increased number of retransmissions, a lower coding rate to provide more redundancy, and/or a modulation scheme that sends fewer bits per symbol. However, using any of these mechanisms can have undesired affects, such as increasing power usage in a user device, decreasing network capacity, lowering spectral efficiency, and/or other disadvantage(s). As such, merely using these mechanisms that are built into LTE to improve channel performance is not likely to be enough to differentiate a service provider or device manufacturer from competitors.

BRIEF SUMMARY OF THE INVENTION

Methods, systems, and apparatuses are described for a modem configured to perform joint source channel coding using multiple turbo decoders substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate the subject matter of the present application and, together with the description, further serve to explain the principles of the embodiments described herein and to enable a person skilled in the pertinent art to make and use such embodiments.

FIG. 7 shows a process for using a cipher stream for decryption of soft and hard bits, according to an example embodiment.

FIG. 8 shows a flowchart providing a process for decrypting and inserting hard bits generated by a second turbo decoder into a data stream, according to an example embodiment.

FIG. 9 shows a flowchart providing a process for decrypting and encrypting soft bits during an iteration of the second turbo decoder to decode a received packet of a source signal, according to an example embodiment.

Figure 1:
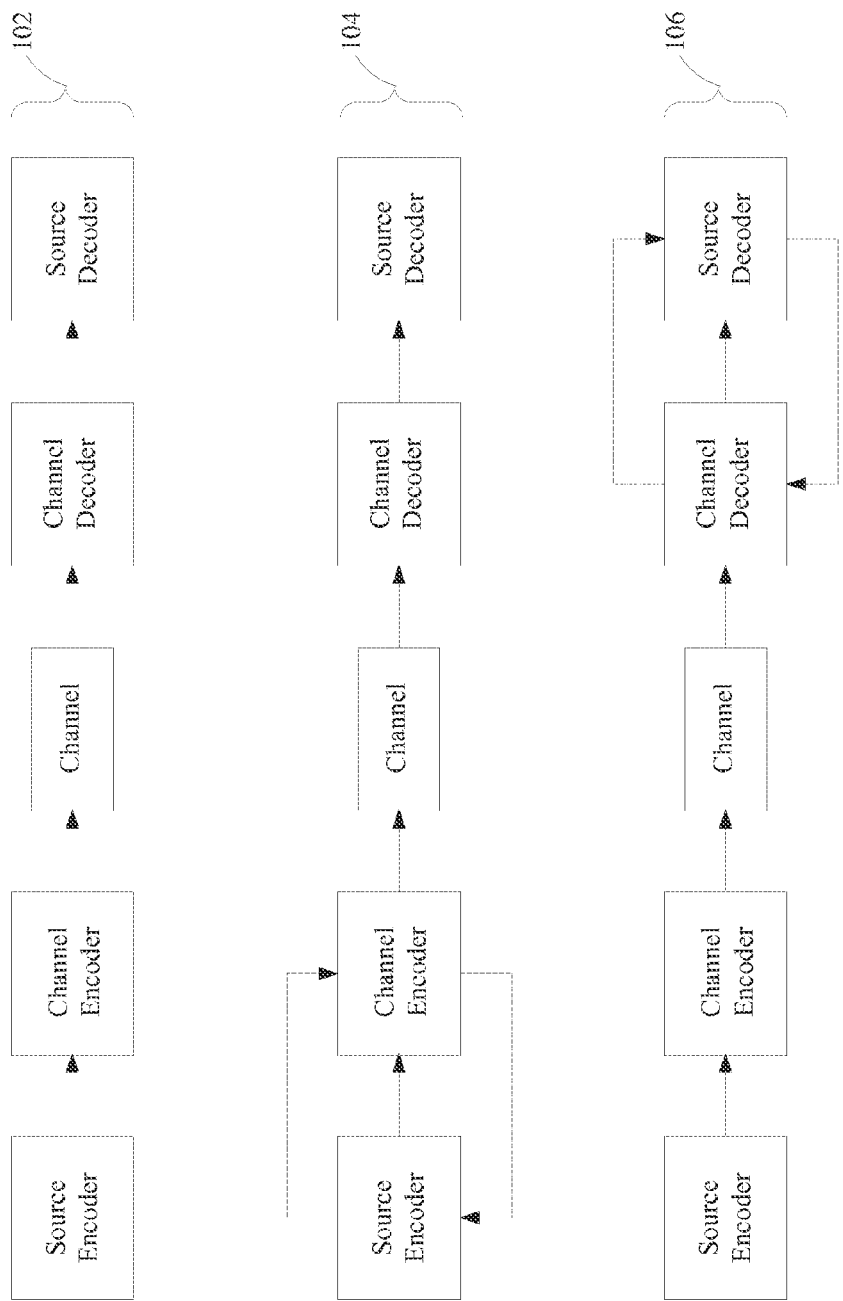
FIG. 1 is a block diagram that shows examples of conventional coding and decoding models.

The subject matter of the present application will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

A. Introduction

The following detailed description discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Furthermore, terminology used herein to refer to decoder decisions and other information as "hard" refers to whether the decision or information represents actual, perceived data bits (e.g., a '1' (logical high signal value) or a '0' (logical low signal value)). The "hard" values are the actual data bits and/or what a decoder has determined the actual data bits to be. Terminology used herein to refer to decoder decisions and other information as "soft" refers to whether the decision or information are representations of the probability and/or the likelihood of a given bit in the data stream being a '1' or a '0'. "Soft bits," for example, may be represented as a decimal number with a theoretical range between 0 and 1 (e.g., 0.2138 or 0.9853) for a probability, where a value less than 0.5 indicates a likelihood of the actual data bit (i.e., "hard bit") being a '0', while a value greater than 0.5 indicates a likelihood of the actual data bit (i.e., "hard bit") being a '1' (a value of 0.5 indicates an equal probability of '0' or '1'). Similarly, a "soft bit" value may theoretically range from $-\infty$ (negative infinity) to $+\infty$ (positive infinity) for a log likelihood ratio (LLR), where a value less than zero indicates a likelihood of a '0', a value greater than zero indicates a likelihood of a '1', and a value of zero indicates an equal likelihood of a '0' or a '1'. For probabilities and LLRs, the probabilities and likelihoods are stronger for a given data stream bit value (a '1' or a '0') as a probability or LLR approaches the theoretical limits (high or low) of their respective ranges.

Still further, references in the specification to "extrinsics," "extrinsic data," or "extrinsic information" refer to information derived from data parity bits, information derived from processing "soft bits," and/or the like. "Extrinsic information" is used by decoders to facilitate decoding, as described herein. Such extrinsic information may have a numerical value greater than or equal to zero.

The examples described herein may be adapted to various types of wired and wireless communications systems, computing systems, communication devices, and/or the like, which include encoders and/or decoders. Furthermore, additional structural and operational embodiments, including modifications/alterations, will become apparent to persons skilled in the relevant art(s) from the teachings herein.

In embodiments, communication systems may be based on the Long Term Evolution (LTE) IP-based standard for wireless data communications. LTE provides high access rates, low latencies, reduced data delivery costs, and simplification of network architecture. Such embodiments may also provide Voice over LTE (VoLTE) services that are implemented as Voice over Internet Protocol (VoIP), which is supported by the IP Multimedia Subsystem (IMS) with specific profiles for control and media planes of voice service defined by Global System for Mobile Communications Association (GSMA) in Permanent Reference Document (PRD) IR.92 titled "IMS Profile for Voice and SMS" (v4.0, Mar. 22, 2011) (hereinafter "IR.92").

Communication system bandwidth used by data applications may in many cases be greater than the bandwidth for voice calls, but voice applications remain an important part of communication system utilization. It follows then that voice quality will remain a very important metric to consumers and companies which provide services and products. The embodiments described herein (e.g., for VoLTE) provide improved voice quality, decreased packet loss rates, and reduced channel noise for communication systems without undue decreases in network capacity and/or increased power consumption.

LTE communication systems may encode and decode data that is transmitted on communication channels using turbo coding. Example embodiments described herein based on turbo coding in LTE take advantage of joint source channel decoding (JSCD) as well as redundancies and correlations present in VoLTE. For example, data may be encoded using joint source channel coding (JSCC). This particular type of encoder may be paired with a JSCD turbo decoder for decoding purposes.

In JSCC, the source (e.g., speech related data) and the channel (e.g., packet related data) are jointly encoded, while in JSCD, the source and the channel are jointly decoded. Embodiments described herein may implement JSCD even if the source and channel are not jointly encoded. JSCD as described in the example embodiments may allow for an optimized channel capacity while providing joint decoding benefits such as improved communication efficiency, data integrity, and performance as well as adherence to VoLTE standards.

Turbo decoding generates a "soft bit" decision representation of the data bits in a data stream that represents the likelihood of a given bit in the data being a logical "1" or a logical "0". These likelihoods may be presented as a ratio of probabilities, as will be discussed in further detail below. In example embodiments, a turbo decoder may include two or more decoders which work cooperatively in order to refine and improve the estimate of the original data bits over one or more iterations until the soft decisions converge on a stable set of values or until the preset maximum number of iterations is reached. Each decoder may be injected with extrinsic information (e.g., determined by the other decoder and/or based on a-priori information (e.g., source statistics regarding the source signal)). The decoders may be based on the MAP (maximum a-posteriori probability) algorithm and may output the soft decision information determined from received data and corresponding parity bits. The converged soft decisions may then be used to recover the original binary data sequence.

Embodiments presented herein improve JSCD by exploiting parameter-based (parameter domain) correlation. The embodiments presented herein may exploit parameter domain correlation with respect to various types of parameters in voice data packets, such as, but not limited to speech coding parameters and packet header parameters.

Numerous exemplary embodiments are described as follows. It is noted that any section/subsection headings provided herein are not intended to be limiting. Embodiments are described throughout this document, and any type of embodiment may be included under any section/subsection. Furthermore, disclosed embodiments may be combined with each other in any manner.

The next subsection provides further information regarding joint source channel coding and decoding, and is followed by a subsection describing some sources of redundancy in VoLTE (voice over LTE) communications. Subsequent subsections describe example embodiments for modem architectures, including systems and methods for the same.

B. Joint Source Channel Coding

In 1948, Shannon introduced the concept of channel capacity in "A Mathematical Theory of Communication," Bell System Technical Journal, 27 (3), pp. 379-423 (July/October 1948) (hereinafter "Shannon"), which is incorporated by reference herein in its entirety. Shannon laid out the basic elements of communication that includes an information source that produces a message, a transmitter that operates on the message to create a signal, which can be sent through a channel, a receiver that transforms the signal back into the message for delivery, and a destination that can be a machine for which the message is intended. Shannon further stated that a source with entropy H can be reliably transmitted over a channel with capacity C as long as H≤C. Shannon's article also introduced the Separation Theorem, which stated that the maximum capacity is achievable by treating the source and channel independently.

Examples of channel coding and decoding models are shown in FIG. 1. For example, Shannon's independent treatment of the source and channel is shown in model 102 of FIG. 1. In model 102, a source encoder is first applied to reduce the rate down to H, and a channel encoder is subsequently applied. At the receiver, the channel decoder is unaware of the type of source and outputs the most probable codeword. The source decoder then reconstructs the source without any knowledge of the channel statistics. However, Shannon's Separation Theorem only holds true in the case of infinite complexity and delay, as well as non-time-varying, e.g., Additive White Gaussian Noise (AWGN) channel. When operating with finite complexity and delay on a channel that may vary in time (i.e., fading), better performance is generally achievable by jointly optimizing the source and channel coding.

For instance, model 104 shows joint source channel coding (JSCC), where the source and the channel are jointly encoded. Model 106 shows joint source channel decoding (JSCD), where the source and the channel are jointly decoded. A system may employ both JSCC and JSCD. However, most communications systems employ very little JSCC or none at all. To consider JSCC in 2G, 3G, or LTE would mean a change in the standards, which is not desirable. However, significant gains can still be achieved in these systems by incorporating JSCD, which effects no change to the standards.

Figure 2:
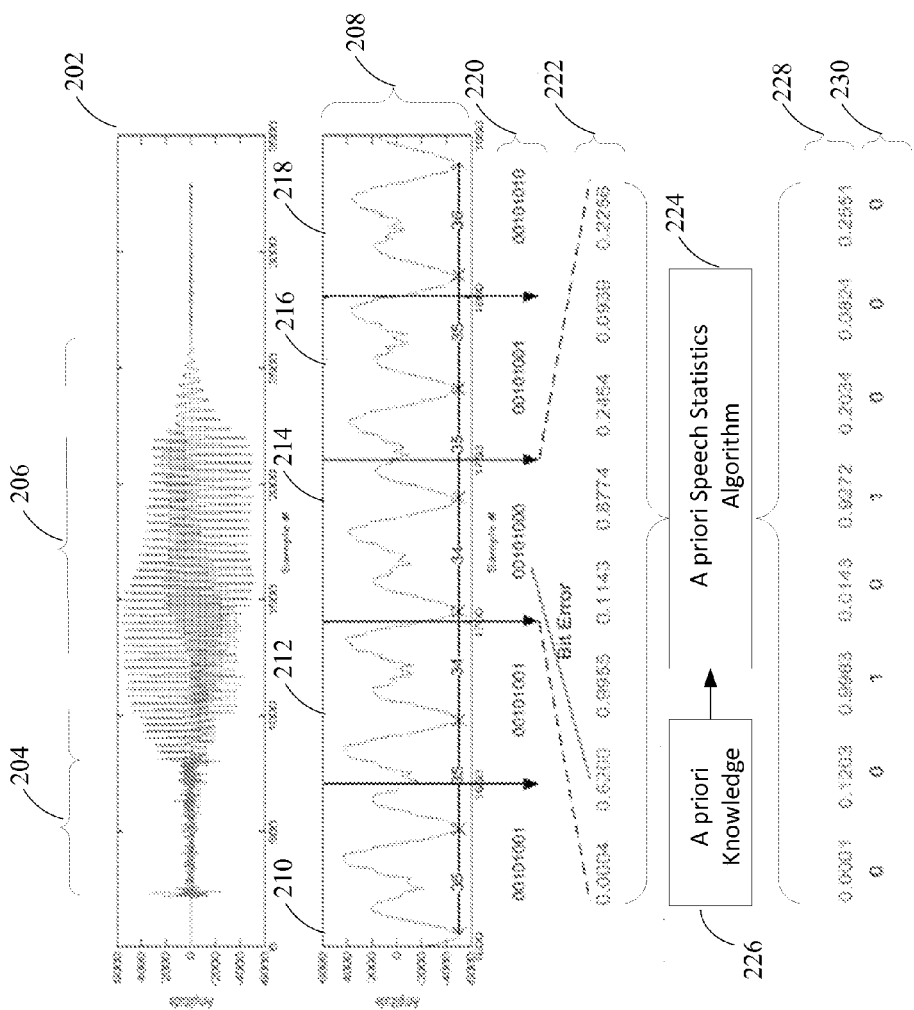
FIG. 2 shows waveforms that are illustrative of an example of joint source channel decoding (JSCD).

FIG. 2 shows first and second waveforms 202 and 208 that are illustrative of an example of JSCD. Waveform 202 is a waveform representative of the spoken word "cave." First waveform 202 includes an unvoiced segment 204 and a voiced segment 206. Voiced segment 206 contains the vowel "a" that is pronounced in the middle of the utterance of the word "cave." First waveform 202 is repetitive with a period that is equal to the pitch. Second waveform 208 is an enlarged view of voiced segment 206 and includes first-fifth frames 210, 212, 214, 216, and 218. It can be seen from second waveform 208 that first waveform 202 is similar from one pitch period to the next. In addition, the pitch period itself remains nearly steady. In this example, the pitch period track is 35-35-34-34-35-35-36 samples in frames 210-218. This predictability in the pitch contour can be exploited to improve channel decoding.

In the example of FIG. 2, the pitch for each frame is quantized with 8 bits, as shown in quantized pitch bitstream 220. After channel decoding, quantized pitch bitstream 220 for frame 214 is transformed into channel decoder soft bits 222, which may take the example values {0.0004, 0.6200, 0.9955, 0.1143, 0.9774, 0.2454, 0.0939, 0.2256}. With a decision threshold of 0.5 (i.e., a number that is less than 0.5 would be considered a 0, and a number that is greater than 0.5 would be considered a 1), soft bits 222 correspond to {01101000}, which contains a bit error in the second most significant bit. In other words, the second most significant bit of soft bits 222 is 0.6200, indicating a 1, which is an error because the second most significant bit of quantized pitch bitstream 220 for frame 214 is actually a 0 in this example. A priori knowledge 226, such as the pitch, can be used to improve channel decoding to correct this error. It is possible to determine a probability density function (PDF) of the pitch difference from one frame to the next frame in voiced speech. In this example, the pitch difference between frames 210-218 is 0, 1, 0, 1, 0, 1. In particular, for the pitch period track 35-35-34-34-35-35-36, the difference between the first pitch period (35) and the second pitch period (35) is 0, and the difference between the second pitch period (35) and the third pitch period (34) is 1, and so on. Thus, the difference appears to be very close to 0, which is shown in the PDF as a sharp distribution around 0.

From the channel decoder, it appears that there is a 62 percent chance that the second most significant bit is a 1, but a priori knowledge 226 (e.g., PDF of pitch difference) indicates a high probability that the second most significant bit is a 0. Utilizing the channel decoder information and a priori knowledge 226 in JSCD in a priori speech statistics algorithm 224, it is possible to determine new JSCD soft bits 228. Correctly decoded hard bits 230 may be determined, in turn, from JSCD soft bits 228. In particular, JSCD soft bits 228 shows that the second most significant bit has a value of 0.1203, which corresponds to a hard bit 0, which is the correct value.

Accordingly, in this manner, channel decoder information and a priori knowledge may be used in JSCD to provide more accurate decoding of voice data frames. Such an a priori speech statistics algorithm (e.g., a priori speech statistics algorithm 224) may be used in embodiments to improve voice data decoding accuracy for JSCD.

C. Sources of Redundancy in VoLTE

In VoLTE, there are two main sources of redundancy that can be exploited to improve the voice quality in channel decoding. The first is "source redundancy," which is the residual redundancy that remains after encoding the speech waveform with a codec (e.g., Adaptive Multi-Rate (AMR), including AMR-Narrow Band (AMR-NB) or AMR-Wide Band (AMR-WB), or other codec). The second is "protocol redundancy," which is the redundancy from headers added at each layer of the LTE radio protocol layer/protocol stack. Embodiments described herein may use these types of redundancy to improve the decoding of data packets. These sources of redundancy are described below in connection with FIGS. 3 and 4.

i. Source Redundancy

AMR is an example of a multi-mode audio codec that may be used in LTE. The different modes of AMR are listed below in Table 1: eight modes are available in a full rate channel (FR) and six modes are available in a half rate channel (HR).

TABLE 1

AMR Modes

| Mode | Bitrate (Kbit/s) | Channel |
|---|---|---|
| AMR_12.20 | 12.2 | FR |
| AMR_10.20 | 10.2 | FR |
| AMR_7.95 | 7.95 | FR/HR |
| AMR_7.40 | 7.4 | FR/HR |
| AMR_6.70 | 6.7 | FR/HR |
| AMR_5.90 | 5.9 | FR/HR |
| AMR_5.15 | 5.15 | FR/HR |
| AMR_4.75 | 4.75 | FR/HR |

JSCD has the potential for improved performance due to the redundancy inherent in the source signal. It is possible to determine the amount of residual redundancy in the bitstream of AMR-NB. To do this, the entropy rate of the parameters is estimated.

Let $\{X_i : i=1, 2, \ldots\}$ denote a stationary discrete-time random process, with each $X_i$ taking values in some finite set $\chi$. The entropy rate of this process is defined as $$H_X = \lim_{n \to \infty} H(X_n \mid X_1, \ldots, X_{n-1})$$

where $$H(X_n \mid X_1, \ldots, X_{n-1}) = -\sum_{[x_1, \ldots, x_n] \in \chi^n} p(X_1 = x_1, \ldots, X_n = x_n) \cdot \log_2[p(X_n = x_n \mid X_1 = x_1, \ldots, X_{n-1} = x_{n-1})].$$

$H_X$ represents the minimum rate (in bits per symbol) at which the process $\{X_i\}$ can be encoded without incurring distortion; alternatively, if the process is encoded at a rate R bits/letter, the quantity $\rho_T = R - H_X$ is the residual redundancy incurred by encoding.

To estimate the residual redundancy of the AMR-NB parameters, it is necessary to provide a probabilistic model for their generation. It is assumed that the parameters can be modeled by a stationary first-order Markov chain. Hence, $$p(X_n = x_n \mid X_1 = x_1, \ldots, X_{n-1} = x_{n-1}) = p(X_n = x_n \mid X_{n-1} = x_{n-1})$$

and $$H_x = H(X_n \mid X_{n-1})$$
$$= -\sum_{x_n, x_{n-1} \in \chi^n} p(X_n = x_n, X_{n-1} = x_{n-1}) \cdot \log_2[p(X_n = x_n \mid X_{n-1} = x_{n-1})]$$

The total redundancy, $\rho_T$, can be broken into two terms:

$$\rho_T = \rho_D + \rho_M$$

where $\rho_D$ is the redundancy due to the non-uniform distribution of the parameter, and $\rho_M$ is the redundancy due to the correlation between parameters in consecutive frames. The term $\rho_D$ is estimated by:

$$\rho_D = R + \sum_{x_n \in \chi} p(X_n = x_n) \cdot \log_2 p(X_n = x_n).$$

The residual redundancy due to temporal correlation is then obtained as:

$$\rho_M = \rho_T - \rho_D.$$

An analysis for AMR-NB 12.20 yields the following results in Table 2. For example, in a 244-bit AMR_12.20 frame, there is a total redundancy of 23.2 bits in voiced speech and 16.9 bits in unvoiced speech.

TABLE 2

AMR-NB 12.20 Redundancy for Voiced (v) and Unvoiced (uv) Speech

| Parameter (sub-frame) | Bits | H (v, uv) | $\rho_T$ (v, uv) | $\rho_D$ (v, uv) | $\rho_M$ (v, uv) |
|---|---|---|---|---|---|
| Pitch (1,3) | 9 | 5.40, 7.69 | 3.60, 1.31 | 0.58, 0.37 | 3.02, 0.94 |
| Pitch (2,4) | 6 | 4.34, 5.39 | 1.66, 0.61 | 1.32, 0.41 | 0.34, 0.20 |
| LSP Ndx 0 | 7 | 5.17 | 1.83 | 1.35 | 0.49 |
| LSP Ndx 1 | 8 | 6.17 | 1.83 | 1.06 | 0.76 |
| LSP Ndx 2 | 9 | 7.15 | 1.85 | 0.75 | 1.09 |
| LSP Ndx 3 | 8 | 6.80 | 1.20 | 0.72 | 0.48 |
| LSP Ndx 4 | 6 | 5.04 | 0.96 | 0.58 | 0.39 |
| ACB Gain | 4 | 3.36, 3.23 | 0.64, 0.77 | 0.47, 0.71 | 0.17, 0.06 |
| FCB Gain | 5 | 3.93, 3.96 | 1.07, 1.04 | 1.02, 0.71 | 0.05, 0.33 |

It is noted that the techniques described herein may be applied to any type of source signal, such as voice, images, and videos. Examples provided herein may be described with respect to VoLTE. However, these examples are provided for illustration, and are not intended to limit the scope of the present patent application to voice applications.

ii. Protocol Redundancy

Figure 3:
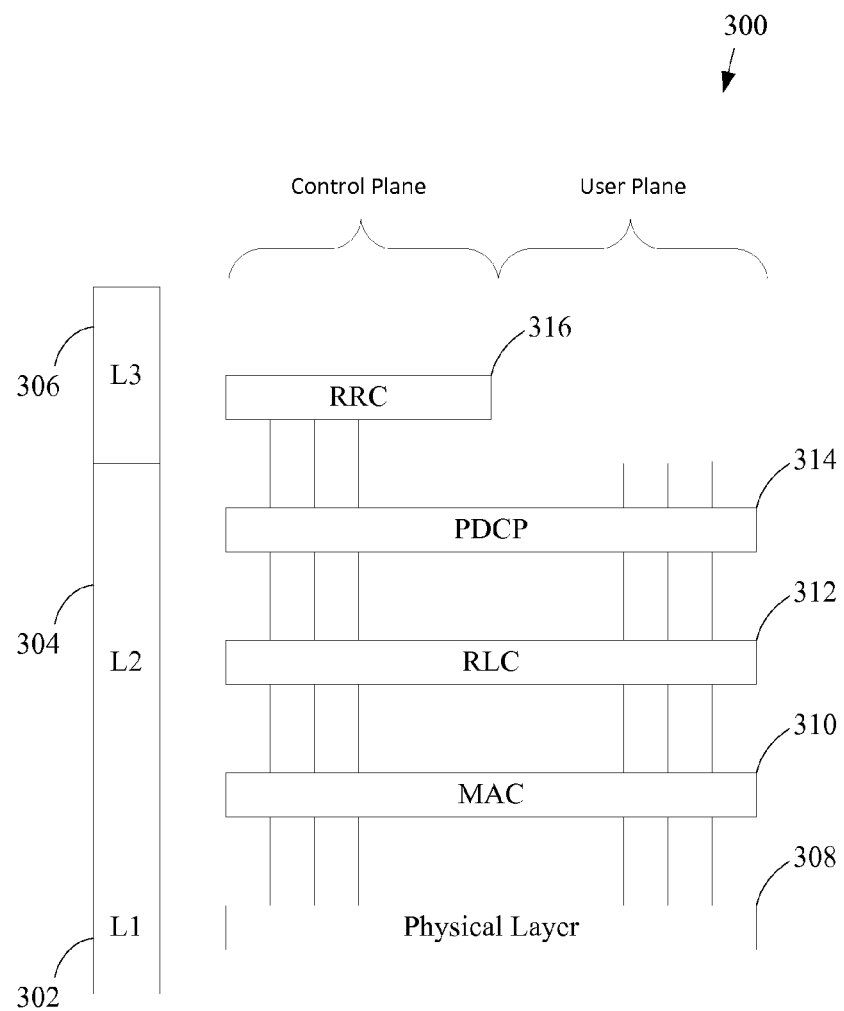
FIG. 3 shows a block diagram of an LTE (long term evolution) radio protocol layer/protocol stack having multiple sub-layers.

In addition to the redundancy in AMR-NB parameters that may be exploited to improve JSCD, LTE protocol layers also contain some redundancy that may be exploited. A block diagram of an LTE radio protocol layer/protocol stack 300 is shown in FIG. 3. Protocol stack 300 has several aspects that pertain to optimizing performance for VoLTE. Protocol stack 300 may be structured into three general layers 302, 304, and 306, each of which may contain other sub-layers. Layer 302 is the lowest level in protocol stack 300, and includes physical layer 308. Physical layer 308 includes channel coding, error detection, modulation/demodulation, and other procedures that handle power control, multi-antenna operation, etc. In the current LTE example, physical layer 308 implements orthogonal frequency division multiple access (OFDMA)

modulation for downlink and single carrier frequency division multiple access (SC-FDMA) modulation in the uplink.

Layer 304 is an intermediate layer in protocol stack 300, and is the data-link layer. Layer 304 may include a medium access control (MAC) layer 310, a radio link control (RLC) layer 312, and a packet data convergence protocol (PDCP) layer 314, in order of the lowest layer to the highest layer in layer 304. MAC layer 310 is configured to perform functions that include mapping and multiplexing of logical channels to transport channels. MAC layer 310 also handles physical layer retransmissions, which may be implemented with a hybrid automatic retransmission request (HARQ) buffer. The HARQ may be applied to voice due to the low delay property. MAC layer 310 also handles scheduling with priority handling to ensure a sufficient level of quality of service. RLC layer 312 is configured to handle retransmissions and segmentation, both of which are not normally used for voice. PDCP layer 314 is configured to perform ciphering and header compression.

Layer 306 is the highest layer in protocol sack 300, and includes a radio resource control (RRC) layer 316 that handles control signaling for radio operation, including measurement control and handover commands. RRC layer 316 is not involved in the user plane, and generally does not pertain to the optimization of performance for VoLTE. Thus, protocol stack 300 includes physical layer 308 through RRC layer 316 with physical layer 308 being the lowest sub-layer and RRC 316 being the highest sub-layer. For a given layer in protocol stack 300, any layer that is higher than the given layer is considered an upper layer in relation to the given layer, and any layer that is lower than the given layer is considered a lower layer in relation to the given layer.

An aspect of physical layer 308 that has a high impact on the optimization of VoLTE is the channel coding, for which LTE uses turbo codes. Turbo codes enable near Shannon-limit capacity performance with manageable complexity. Such channel encoders/decoders may herein be referred to as turbo encoders/decoders.

Figure 4:
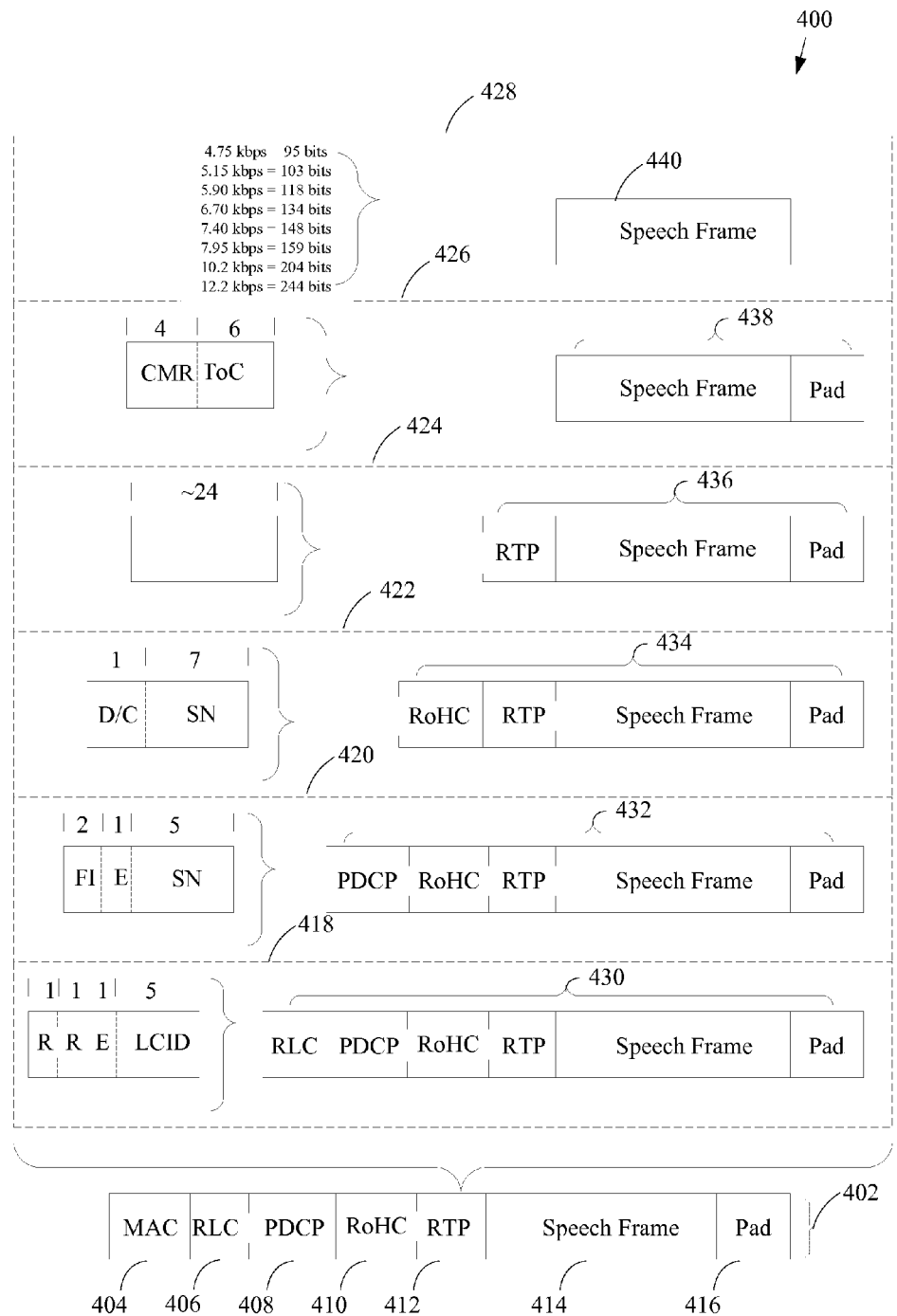
FIG. 4 shows block diagram views of a VoLTE (voice over LTE) packet at multiple different stages of encoding or decoding, according to example embodiments.

FIG. 4 shows a progression of an example VoLTE packet 402 through the multiple layers of a protocol stack 400. Protocol stack 400 includes a medium access control (MAC) layer 418, a radio link control (RLC) layer 420, a packet data convergence protocol (PDCP) layer 422, a robust header compression (RoHC) layer 424, a real-time transport protocol (RTP) layer 426, and an AMR layer 428 (an application layer that includes the AMR decoder). At the source device that generates VoLTE packet 402, each sub-layer of protocol stack 400 appends a header and/or payload to the speech frame to create a protocol data unit (PDU) for that layer. Packet 402 is formed after all of the headers and padding have been appended to the speech frame. While not shown in FIG. 4, a 24-bit cyclic redundancy check (CRC) block may be appended to packet 402 before it is transmitted to the receiver.

As shown in FIG. 4, a base speech frame 400 may be received at AMR layer 428 that is to be transmitted from the source device. Speech frame 400 includes voice data generated from captured voice/speech. Speech frame 440 ranges from 95 bits to 244 bits in size, depending on the AMR mode. Padding (or pad) 416 may be added to speech frame 440 to form PDU 438 at AMR layer 428. At RTP layer 426, in a Bandwidth-Efficient Mode, a header that includes a codec mode request (CMR) field and a table of contents (ToC) is added to PDU 438 to form PDU 436. The CMR field and the ToC field have sizes of 4 bits and 6 bits, respectively. Alternatively, in an Octet-Aligned Mode, the header added at RTP layer 426 can include a 4-bit CMR field, 4 bits of padding, a 6-bit ToC field, and 2 bits of padding. In the Octet-Aligned Mode, all the fields are individually aligned to octet boundaries to make implementations more efficient. In the Bandwidth-Efficient Mode, only the full payload is octet aligned, so fewer padding bits are added. A payload for each mode may include the header, speech frame, and overhead padding. Between the two operational modes, only the Octet-Aligned Mode has the capability to use robust sorting, interleaving, and frame cyclic redundancy check (CRC) to make the speech transport more robust to packet loss and bit errors. Frame CRC may be used to protect the most sensitive bits in AMR. At RoHC layer 424, a header of varying sizes is appended to PDU 436 to produce PDU 434. For normal VoIP communication, most packets include a RoHC header of 1 byte, 2 byte, or 3 bytes.

As further shown in FIG. 4, PDCP layer 422 appends a header that is 8 bits in size to produce PDU 432. The PDCP header includes a PDCP sequence number (SN) field, and a distinguish data and control (D/C) field. The length for the S field may either be 5, 7, or 12 bits. For voice packets, the length is 7 bits. PDCP layer 422 provides services such as transfer of user plane data; transfer of control plane data; header compression; ciphering; and integrity protection.

As shown in FIG. 4, RLC layer 420 appends a header that includes an FI field indicating whether a RLC SDU is segmented at the beginning and/or at the end of the data field; an E field that indicates whether data that follows the field is a data field or a set of E and FI field; and a sequence number SN field that indicates the sequence number of the corresponding unacknowledged mode data (UMD) PDU. The header of RLC layer 420 has a size of 8 bits. A header of RLC layer 420 is appended to PDU 432 to form PDU 430. RLC layer 420 supports transfer of upper layer PDUs; error correction; concatenation, segmentation, and reassembly of RLC service data units (SDUs); re-segmentation of RLC data PDUs; reordering of RLC data PDUs; duplicate detection; RLC SDU discard; RLC re-establishment; and protocol error detection.

FIG. 4 further shows a header for MAC layer 418 that includes a logical channel identification (LCID) field, an extension (E) field, and reserve (R) bit(s), the combination of which comprises 8 bits. When single-byte or two-byte padding is required but cannot be achieved by padding at the end of the MAC additional LCID field(s) may be added. MAC layer 418 provides data transfer and radio resource allocation services to upper layers. In addition, MAC layer 418 supports mapping between logical cannels and transport channels; multiplexing of MAC SUDs from one or different logical channels onto transport blocks to be delivered to the physical layer on transport channels; demultiplexing of MAC SDUs from one or different logical channels from transport blocks delivered from the physical layer on transport channels; scheduling information report; error correction through HARQ; priority handling between user equipment (UEs) by means of dynamic scheduling; priority handling between logical channels of one UE; logical channel prioritization; and transport format selection.

Packet 402 is formed after the various headers and padding have been appended to speech frame 440. Packet 420 includes a MAC header 404, an RLC header 406, a PDCP header 408, a RoHC header 410, an RTP header 412, a speech frame 414, and padding 416. The maximum code block size is 6144 bits. However, for voice only packets, the code block is on the order of a few hundred bits for 1 frame per packet, and is less than 6144 bits for all allowable number of frames per packet. A maximum number of frames allowed may be 12 frames per packet. For VoLTE, 1 frame per packet is recommended. The VoLTE packet size varies depending on the AMR mode. For example, in the AMR_12.20 mode, the AMR size is 244 bits in a 256-bit frame. The 256-bit frame includes 12 bits of headers. The combination of speech frame, headers, CRC block, and padding forms a 352-bit PDU that is transported over the air.

At the receiver device, headers 404-412 of packet 402 are sequentially removed from packet 402 as it progresses through the different sub-layers a protocol stack similar to protocol stack 400, but in reverse order. According to embodiments, headers 404-412 may be exploited at the receiver device to improve JSCD because of the redundancy present in headers 404-412. For example, headers 404-412 may contain a sequence number, which is predictable from frame to frame. Thus, if one frame has a sequence number of 654, then the next frame can be predicted to have the sequence number 655. These and further redundancies of information in headers 404-412 may be used in embodiments to improve packet decoding, as further described below.

D. Example Modem Architecture that Supports JSCD

In addition to LTE built-in mechanisms to combat channel noise, JSCD is another approach to improve voice quality in a VoLTE framework. In embodiments, source and/or protocol redundancy may be exploited to improve packet decoding by integrating this a priori knowledge with the channel decoder in operating JSCD. JSCD techniques improve the link budget of a multimedia transmission when compared to classical schemes. In the classical approach to network design, the networking task is portioned into distinct layers, where each layer assumes that layers below it behave perfectly and attempts to provide perfect information to layers above it. According to embodiments, using the JSCD approach, the network layers become more transparent such that information previously available at only one layer is accessible to other layers.

Example embodiments for modem architectures that may be applied to a modem are described herein. Such embodiments support the application of joint source channel decoding (JSCD) for a source signal, which may include voice, images, video, and/or other data. For instance, a modem architecture may include two channel decoders. This dual-decoder approach advantageously enables a second turbo decoder to be modified to provide improved performance, while a first turbo decoder is not necessarily modified. In an embodiment, the modem architecture further includes transparent protocol/network layers that enable the passage of information from one layer to another layer. For example, the modem architecture enables soft bits, when available, to be passed from the physical layer to the application layer of the modem. These soft bits may be utilized for JSCD, packet loss concealment, and/or other applications. The modem architecture also enables encryption and decryption of data to incorporate extrinsic information about the source signal in operating JSCD.

Figure 5:
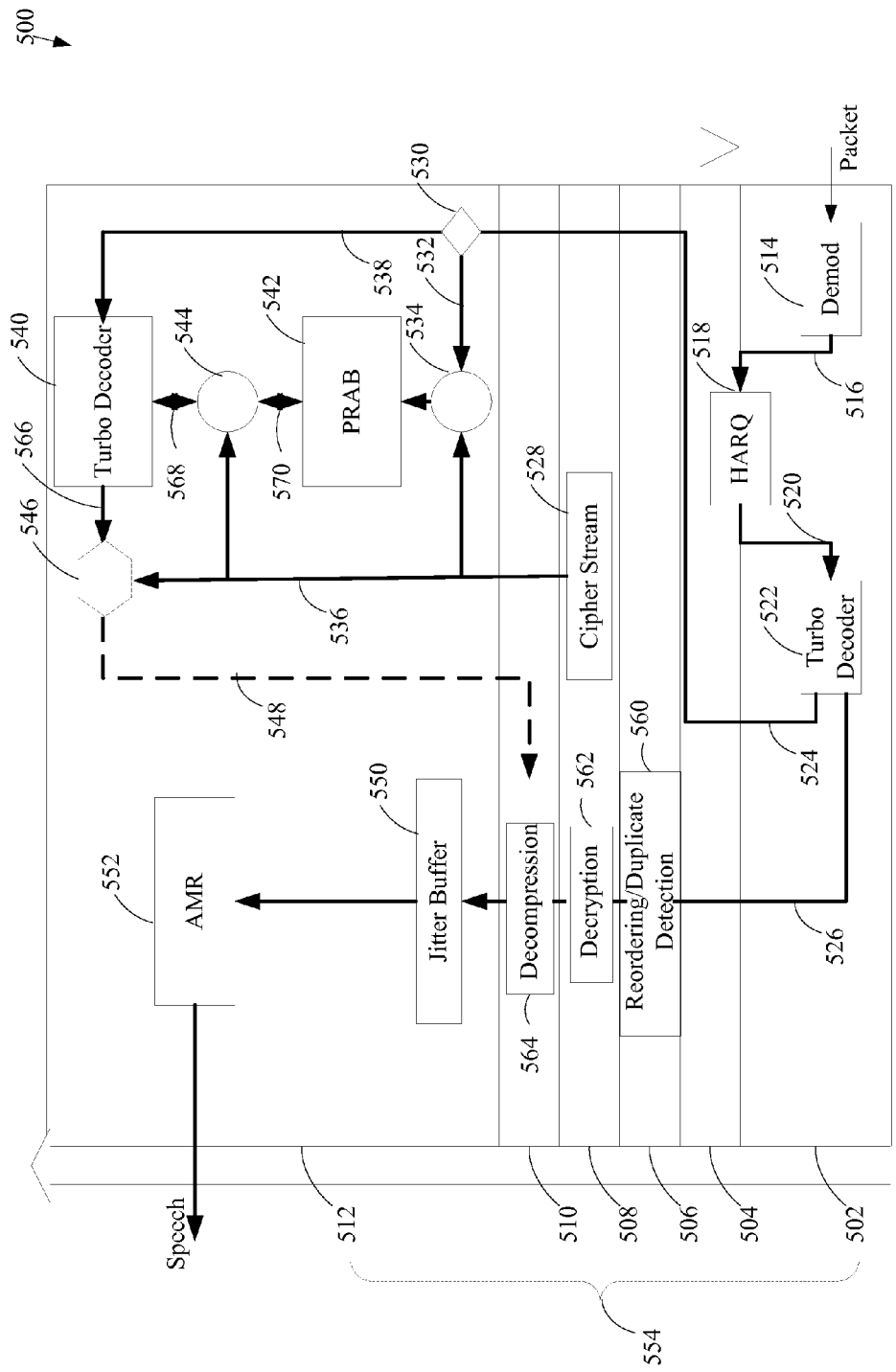
FIG. 5 shows a block diagram of a modem architecture including a pair of turbo decoders that support JSCD, according to an example embodiment.

Such a modem architecture may be configured in various ways. For instance, FIG. 5 shows a modem architecture 500 that supports JSCD, according to an example embodiment. Modem architecture 500 is configured to enable voice quality to be improved in a VoLTE framework by way of incorporating a second turbo decoder modified with a packet redundancy analysis block in an application layer of modem architecture 500. This turbo decoder at the application layer may be configured to operate exclusively on voice data. As shown in FIG. 5, modem architecture 500 includes a protocol stack 554 that includes a physical (PHY) layer 502, a MAC layer 504, an RLC layer 506, a PDCP layer 508, a RoHC layer 510, and an application (APL) layer 512. Each element of modem architecture 500 shown in FIG. 5 may be implemented as hardware, or a combination of hardware and software and/or firmware (e.g., an electronic circuit, an application processor, a digital signal processor, a computer program, etc.). The elements of modem architecture 500 are described as follows.

PHY layer 502 includes channel coding, error detection, modulation/demodulation, and/or other procedures to handle power control, multi-antenna operation, and/or the like. PHY layer 502 may implement orthogonal frequency division multiple access (OFDMA) for downlink communications and single carrier frequency division multiple access (SC-FDMA) for uplink communications, or other modulation schemes as appropriate. As shown in FIG. 5, PHY layer 502 includes a demodulator 514, a HARQ block/buffer 518, and a physical layer turbo decoder (PHY-TD) 522. An antenna receives incoming data signals on a data channel and transmits the received data signal to demodulator 514 via a communication line. For instance, a stream of packets, such as packet 402 shown in FIG. 4, may be transmitted by a transmitter of a remote device, and received at demodulator 514. Each packet may carry one or more encoded frames of a source signal, where each encoded frame is a segment of the source signal that include voice/speech, video, images, etc. Demodulator 514 demodulates the received data signal and transmits the demodulated data to HARQ buffer 518 via a communication line. For example, demodulator 514 may demodulate a packet to generate a demodulated packet 516.

HARQ buffer 518 receives demodulated packet 516 from demodulator 514. Demodulated packet 516 may contain systematic bits, error detection (ED) bits, and a subset of forward error correction (FEC) bits. If the ED bits indicate errors, HARQ buffer 518 may send a request to the transmitter for retransmission. Successive transmissions include a bitstream corresponding to different subsets of demodulated packet 516. In other words, at this stage, only a part of the packet rather than the entire packet may be retransmitted in response to a retransmission request from HARQ buffer 518. Any received data resulting from retransmissions (if needed) are combined with the originally received data in a process called incremental redundancy, the result of which is a transport block 520 that is output from HARQ buffer 518 to PHY-TD 522. Transport block 520 includes the data of the received packet. This hybrid retransmission scheme is efficient in both good and poor channel conditions. Due to latency constraints, a maximum of two retransmissions is available for VoLTE, although further retransmissions may be made in embodiments. Usually, the first retransmission improves LTE performance by almost 4 decibel (dB), while the second retransmission improves performance by another 1.6 dB. The improvement may come at the cost of increased power usage in the user device because more power is needed to perform the retransmissions and decreased network capacity because a larger bandwidth is required to convey the signal.

PHY-TD 522 receives transport block 520 from HARQ buffer 518. In an embodiment, PHY-TD 522 may include two internal decoders (MAP decoders) that are configured to perform a maximum a posteriori probability (MAP) algorithm. The two MAP decoders work cooperatively in order to refine and improve an estimate of original information bits. For instance, during a first iteration, the first MAP decoder outputs soft decision information generated from soft data received from demodulator 514, soft parity information derived from the soft data, and any extrinsic information received from the second MAP decoder. During a next iteration, the second MAP decoder outputs soft decision information learned from soft data received from demodulator 514, soft parity information associated with the soft data, and extrinsic information received from the first MAP decoder. These iterations continue until the soft decisions converge on a stable set of values or a max number of iterations is reached. It is noted that during each iteration, each MAP decoder only passes to the other MAP decoder the new extrinsic information that is derived (the extrinsic information received from the other MAP decoder is not passed because the other MAP decoder already knows this extrinsic information). Furthermore, in an embodiment, one of the MAP decoders may process an interleaved version of the soft data received from demodulator 514, while the other MAP decoder may process a non-interleaved version of the received soft data.

In accordance with some embodiments, to determine whether the soft decisions converge on a stable set of values, a cyclic redundancy check (CRC) operation may be performed. For instance, a check value of the soft decision(s) may be determined and compared to a check value received via the data packet. If the two check values are equal to each other, then the CRC operation passes, and a determination is made that the soft decisions have converged on a stable set of values. If the two check values are not equal to each other, then the CRC operation fails, and a determination is made that the soft decisions have not converged on a stable set of values. The CRC operation may be performed on soft decisions provided by either MAP decoder.

PHY-TD 522 handles the decoding of all traffic and processes such traffic without knowledge of the type of traffic it is processing. PHY-TD 522 outputs soft bits 524 and hard bits 526, both set of bits may be encrypted because PHY-TD 522 operates in an encrypted domain. Hard bits 526 (actual data bits) may be similar to decoded hard bits 228 shown in FIG. 2. Soft bits 524 (reliability indications) may be similar to channel decoder soft bits 222 shown in FIG. 2. For instance, soft bits 524 may generally be represented as log likelihood ratios (LLRs). An LLR represents the likelihood that the particular bit is either a "1" or a "0". For example, if the LLR is a value greater than "0", then it may be inferred that the MAP decoder has estimated that the particular bit is a "1". If the LLR is a value less than "0", then it may be inferred that the MAP decoder has estimated that the particular bit is a "0". The magnitude of the LLR value may represent a confidence level that a MAP decoder has with regard to its soft decision. For example, the greater the LLR value, the more confident the MAP decoder is in its soft decision. In contrast, the lesser the LLR value, the less confident the MAP decoder is in its soft decision.

MAC layer 504 functions include the mapping and multiplexing of logical channels to transport channels. MAC layer 504 also handles the physical layer retransmissions (e.g., performed via HARQ buffer 518) which are applied to voice due to the low delay associated with voice packets. As shown, HARQ buffer 518 overlaps with MAC layer 504 as well as with PHY layer 502. That is, MAC layer 504 may control, in full or in part, the actual physical retransmission that occurs in PHY layer 502. Scheduling is also implemented in MAC layer 504 with priority handling to ensure a sufficient level of Quality of Service.

RLC layer 506 handles retransmissions and segmentation. As shown, RLC layer 506 includes reordering and duplicate detection block 560 which corrects out of order packet sequences and duplicate packets (generated by a router, for example). Data is transmitted from RLC layer 506 to PDCP layer 508 via a line 242.

PDCP layer 508 handles ciphering and decryption. As shown, PDCP layer 508 includes a decryption block 562 and cipher stream block 528. Decryption block 562 uses a cipher to decode encrypted data passed from the lower layers (e.g., encrypted "hard bits" from PHY-TD 522) and transmit the decoded data to RoHC layer 510. Cipher stream block 528 generates a cipher stream 536, and provides cipher stream 536 to APL layer 512 in order to allow applications and/or circuitry in APL layer 512 to properly decrypt encrypted data (e.g., encrypted "soft bits" provided to APL layer 512).

RoHC layer 510 supports robust header compression as specified in $3^{rd}$ Generation Partnership Project Technical Specification (3GPP TS) 36.323, Internet Engineering Task Force (IETF) Request for Comments (RFC) 3095, and IETF RFC 4815. As shown, RoHC layer 510 includes a decompression block 564 which decompresses Internet Protocol (IP) packet headers for transmission to APL layer 512.

APL layer 512 supports applications and services such as data buffering and speech decoding. APL layer 512 includes a frame decision block 530, a first decrypter/encrypter 534, an application layer turbo decoder (APL-TD) 540, a packet redundancy analysis block (PRAB) 542 (which may include one or more PRAB blocks), a second decrypter/encrypter 544, a third decrypter/encrypter 546, a jitter buffer 550, and an AMR block 552. Jitter buffer 550 buffers voice data for delivery of the voice data to AMR block 552 to allow for smooth output of decoded speech by AMR block 552. In some embodiments, AMR block 552 may be a narrow-band multi-rate speech decoder (AMR-NB). AMR block 552 outputs decoded speech.

APL-TD 540 is configured to decode a data packet that failed to be properly decoded by PHY-TD 522. APL-TD 540 receives encrypted "soft bits" 538, and performs its decoding operations based on the received encrypted "soft bits" and based on extrinsic data inputs received from PRAB 542, discussed in further detail below. APL-TD 540 generates hard bits (the actual data bits for the data packet) in encrypted form as second hard bits 566. The encrypted hard bits are decrypted by decrypter/encrypter 546, and are transmitted to decompression block 564 where the decrypted, decoded data is re-inserted into the data stream. It should be noted, however, that in various embodiments, the hard decision data output by APL-TD 540 may be provided to different elements and/or layers depicted in modem architecture 500.

As such, APL-TD 540 is an additional turbo decoder that runs in APL layer 512 (in addition to turbo decoder 214 that runs in PHY layer 502). Running in APL layer 512 allows the additional turbo decoder to be configurable and flexible in application without modifying or affecting performance of PHY-TD 522 in PHY layer 502. For example, PHY-TD 522 is agnostic with respect to source signal information within a given packet, but APL-TD 540 may be configured in APL layer 512 to utilize packet information to improve channel decoding. That is to say, PHY-TD 522 performs conventional channel decoding operations, while APL-TD 540 is configured to perform JSCD utilizing packet information. Modem architecture 500 also provides for transparent layers through which "soft bits" generated by PHY-TD 522 can be passed to APL layer 512 for use by PRAB 542 and APL-TD 540. For example, if it is determined that a data packet is "good" (e.g., no errors), the "soft bits" may be provided to PRAB 542 to update PRAB states, whereas if it is determined that a data packet is "bad" (e.g., it contains errors), the "soft bits" may be provided to perform JSCD in APL layer 512. Likewise, cipher stream block 528 can provide cipher stream 536 for decrypting and encrypting data in APL layer 512.

Example embodiments are described as follows for using APL-TD 540 to decode a frame of a data packet when PHY-TD 522 fails to do so.

As described above, PHY-TD 522 receives and decodes a transport block 520 to generate hard bits 526 and soft bits 524. If hard bits 526 fail an error check in PHY-TD 522, such as a CRC, then soft bits 524 may be passed from PHY layer 502 to APL layer 512 from PHY-TD 522 to trigger operation of APL-TD 540. Frame decision block 530 receives soft bits 524 and determines whether the frame is a good frame—one that passed the error check, or a bad frame—one that did not pass the error check and needs to be fixed/decoded by APL-TD 540. Frame decision block 530 may make this determination based on a pass/fail indication provided by PHY-TD 522, or in another manner. Frame decision block 530 passes soft bits 524 to APL-TD 540 as soft bits 538 in response to the determination that hard bits 526 for the particular frame failed the error check. Soft bits 538 may be used by APL-TD 540 to start the decoding process where PHY-TD 522 left off (starting with soft bits 538 as an initial state). Alternatively, in an embodiment, APL-TD 540 may start the decoding process anew with an initial state of 0 (i.e., without soft bits 538).

APL-TD 540 functions in a similar manner as PHY-TD 522, with some modification to be enabled to interact with PRAB 542. For instance, encryption and decryption operations may be performed during every iteration of APL-TD 540 to exchange information with PRAB 542. This is because APL-TD 540 operates on encrypted data and PRAB 542 operates on decrypted data. In the case of VoLTE data, an encrypted data stream may be obtained by performing an exclusive or (XOR) operation between the original data, which is decrypted, and cipher stream 536. Furthermore, this encryption process is invertible, and therefore decryption may be performed by performing the XOR operation on the encrypted data and cipher stream 536. Cipher stream 536 does not depend on input data and is passed to application layer 512 every frame.

Soft bits can be passed through the encryption. For example, if $c(i)$ is the cipher stream and $llr(i)$ is the original domain soft-bit, then the encrypted soft-bit is obtained according to the following transform function:

$$ellr(i) = (1 - c(i) \ll 1) \cdot llr(i) \qquad \text{Equation 1}$$

Likewise, the inverse transform function is simply:

$$llr(i) = (1 - c(i) \ll 1) \cdot ellr(i) \qquad \text{Equation 2}$$

Similar to PHY-TD 522, APL-TD 540 may include two MAP decoders where soft decision information of one MAP decoder is used to initialize the other MAP decoder in iterations until the soft decisions converged or a preset maximum number of iterations is reached. In embodiments, the MAP decoders are configured to iteratively provide soft decisions regarding each data bit that the MAP decoders respectively receives. The soft decisions are determined using a MAP algorithm that takes into consideration the received soft data bits, received soft parity bits that are derived from the data bits, and any extrinsic information that is determined and provided by PRAB 542 during any given iteration. In embodiments, PRAB 542 determines extrinsic information based on a priori knowledge of the source signal.

For example, during an iteration, a first MAP decoder of APL-TD 540 generates soft bits (soft decisions) in a similar manner as described above. Extrinsic information previously provided by PRAB 542 is removed from the generated soft bits. PRAB 542 is provided with the soft bits and generates extrinsic information, which may be combined in APL-TD 540 with extrinsic information generated by the first MAP decoder. The combined extrinsic information is passed to a second MAP decoder of APL-TD 540. In a next iteration, the second MAP decoder may generate soft bits in a similar manner as described above, and the extrinsic information previously provided by PRAB 542 is removed from the soft bits. PRAB 542 receives the soft bits, and generates extrinsic information, which may be combined in APL-TD 540 with extrinsic information generated by the second MAP decoder. The combined extrinsic information is passed to the first MAP decoder. Iterations may continue in this manner until the soft decisions converge or a preset maximum number of iterations is reached.

Further details concerning examples of iterative decoding of a data packet using extrinsic information that may be performed by APL-TD 540 and PRAB 542 may be found in commonly-owned co-pending U.S. patent application Ser. No. 13/749,187, entitled "Modified Joint Source Channel Decoder" and filed on even date herewith, the entirety of which is incorporated by reference herein.

For example, in an embodiment, PRAB 542 may include one or both of an a-priori speech statistics algorithm (ASSA) processing block and a packet header statistics algorithm (PHSA) processing block. An ASSA implemented by the ASSA processing block may use a-priori speech information to improve channel decoding. In particular, the correlation of certain source-encoded speech parameters may be used to improve channel decoding. For the AMR-NB (Adaptive Multi-Rate Narrowband) speech codec used in VoLTE, example parameters that may be focused on include, but are not limited to, pitch, Line Spectral Pairs (LSPs), pitch gain, and fixed codebook gain. Models (e.g., probability density functions (PDFs)) may be obtained for each of the parameters and may be applied to update the soft bit values that are obtained for each parameter during channel decoding in APL-TD 540.

A PHSA implemented by the PHSA processing block may use a-priori knowledge of a protocol stack (e.g., protocol stack 300, protocol stack 554, etc.) to improve channel decoding. For instance, models of each protocol layer may be developed that predict the values of the layer headers in future frames. In particular, models (e.g., PDFs) may be obtained for certain header elements and may be applied to update the soft bit values that are obtained for each element during channel decoding in APL-TD 540. Because of the significant redundancy introduced in the headers by the protocol stack, the PHSA used in conjunction with APL-TD 540 provides significant improvement in channel coding performance.

Further details concerning examples of ASSAs and PHSAs that may be implemented by PRAB 542 may be found in commonly-owned co-pending U.S. patent application Ser. No. 13/748,904, entitled "System, Method, And Apparatus for Joint Source Channel Decoding Using Parameter Domain Correlation" and filed on even date herewith, the entirety of which is incorporated by reference herein.

Because APL-TD 540 operates in an encrypted domain and PRAB 542 operates in a decrypted domain, in an embodiment, any data that is exchanged between them needs to be encrypted/decrypted to a format appropriate for each. Thus, decrypter/encrypter 544 decrypts encrypted soft bits provided by APL-TD 540 for providing to PRAB 542. Decrypter/encrypter 544 receives cipher stream 536 and encrypted soft bits from APL-TD 540, and applies the inverse transform function of Equation 2 thereto, to generate decrypted soft bits that are received by PRAB 542. Moreover, PRAB 542 receives the decrypted soft bits, and using the decrypted soft bits along with a priori knowledge, outputs extrinsic information 570, which may be encrypted by decrypter/encrypter 544 for providing to APL-TD 540. Decrypter/encrypter 544 receives cipher stream 536 and extrinsic information 570, and applies the transform function of Equation 1 thereto, to generate encrypted extrinsic information 568 that is received by APL-TD 540. However, no decryption/encryption may be needed if APL-TD 540 and PRAB 542 both operate in the same domain (e.g., both operate on encrypted data, or both operate on decrypted data).

A packet is "fixed" if APL-TD 540 generates the correct hard bits as hard bits 566, which may be encrypted. The hard bits generated by APL-TD 540 may be received by decrypter/encrypter 546 for decryption. Decrypter/encrypter 546 performs an exclusive or (XOR) operation on hard bits 566 generated by APL-TD 540 and cipher stream 536 to generate decrypted hard bits 548 for forwarding to a layer in protocol stack 554, such as RoHC layer 510. In general, decrypted hard bits 548 maybe inserted into any select layer of protocol stack 554 that accepts decrypted information as long as the headers associated with the layer(s) below the selected layer are removed from hard bits 548 prior to insertion (the headers associated with the above layers may be provided with hard bits 548). However, certain layers of protocol stack 554 may be more suitable than others for insertion of decrypted hard bits 548. For example, certain layers of protocol stack 554 may require decrypted hard bits 548 to be in an encrypted format. In this case, encrypted hard bits 566 output from APL-TD 540 may bypass decrypter/encrypter 546 and be directly inserted into those layers of protocol stack 554. In another example, certain layers of protocol stack 554 may have memories that may benefit from a state update as a result of receiving a fixed frame, i.e., decrypted hard bits 548, that would otherwise have failed in PHY-TD 522 and not have passed through those layers. For instance, if decrypted hard bits 548 is to be inserted in RoHC layer 510, the MAC/RLC/PDCP headers should be removed before decrypted hard bits 548 is passed to RoHC layer 510 for decompression. The insertion of decrypted hard bits 548 into RoHC layer 510 has the advantage of improving whatever state memory that may be present at RoHC layer 510 by including the decompression of decrypted hard bits 548 that would otherwise have failed in the PHY-TD 522 and not have passed through RoHC layer 510.

Once inserted into the data stream passing through protocol stack 554, decrypted hard bits 548 follows the same path as a normal frame that was successfully decoded by PHY-TD 522.

When PHY-TD 522 successfully decodes a frame (a "good" frame), APL-TD 540 is not triggered and hard bits 526 are passed up protocol stack 554 as described above. In addition, for frames correctly decoded by PHY-TD 522, PRAB 542 updates its memory with information from the good frames. To facilitate this, the correctly decoded data is passed, in the form of soft bits 524 (and/or optionally hard bits 526) from PHY-TD 522 to frame decision block 530. Frame decision block 530 determines whether soft bits 524 are associated with a good frame. Upon determining that soft bits 524 are associated with a good frame, then frame decision block 530 may pass soft bits 524 to decrypter/encrypter 534. Decrypter/encrypter 534 performs the inverse transform function of Equation 2 on soft bits 524 and cipher stream 536 to generate a decrypted version of soft bits 524, which is received by PRAB 542. If hard bits 526 are provided to PRAB 542, decrypter/encrypter 534 may perform an exclusive or (XOR) operation on hard bits 526 and cipher stream 536 to obtain a decrypted version of hard bits 526 that is received by PRAB 542.

Figure 6:
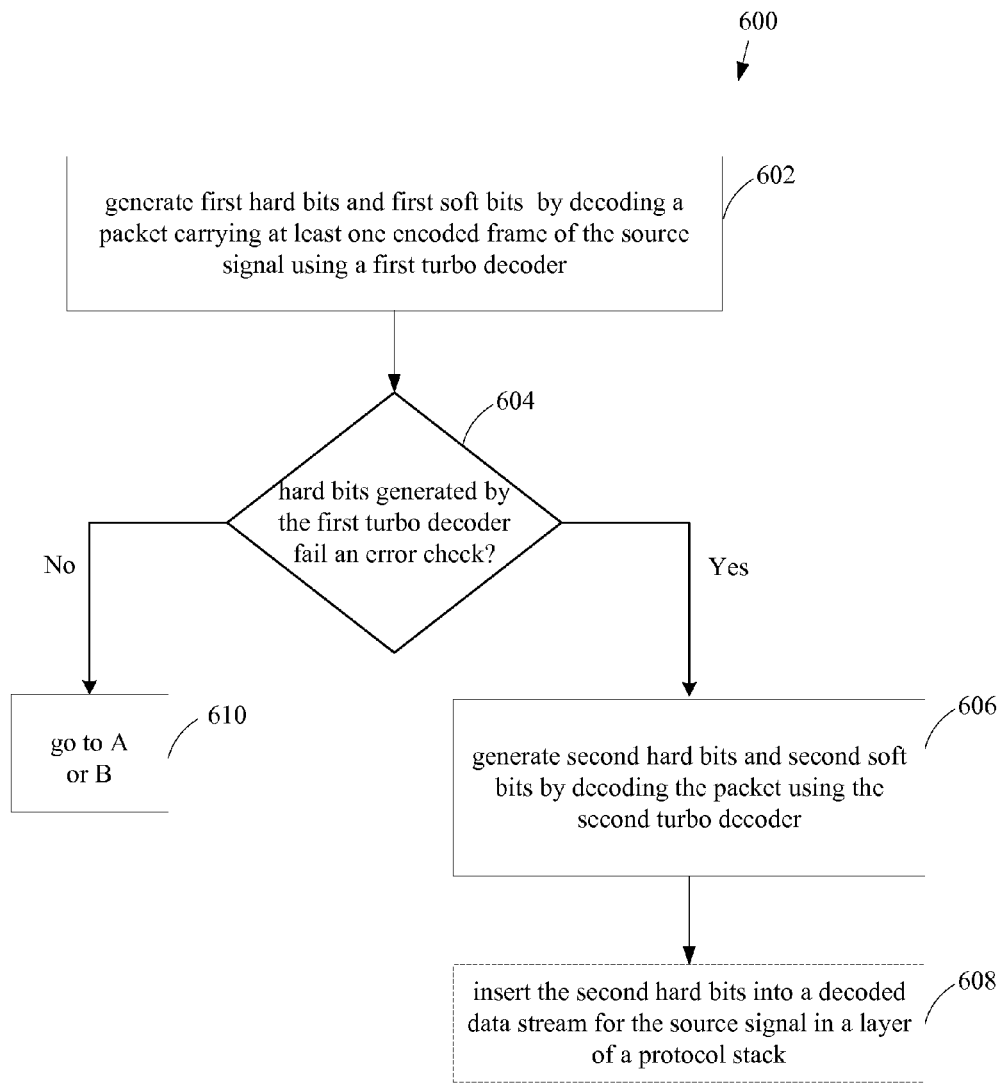
FIG. 6 shows a flowchart providing a process for decoding a source signal, according to an example embodiment.

Accordingly, a source signal may be decoded using JSCD in a variety of ways according to embodiments. For instance, FIG. 6 shows a flowchart 600 providing a process for decoding a source signal, according to an embodiment. Flowchart 600 may be performed by modem architecture 500 shown in FIG. 5, for example. However, flowchart 600 may be performed by other systems in embodiments. Further structural and operational embodiments will be apparent to persons skilled in the relevant art(s) based on the discussion regarding flowchart 600. Flowchart 600 is described as follows.

Flowchart 600 begins with step 602. In step 602, first hard bits and first soft bits are generated by decoding a packet carrying at least one encoded frame of the source signal using a first turbo decoder. For instance, as shown in FIG. 5, a packet carrying at least one encoded frame of a source signal is decoded by PHY-TD 522 to generate hard bits 526 and soft bits 524. Hard bits 526 and soft bits 524 may be generated in an encrypted format.

In step 604, a determination is made whether hard bits generated by the first turbo decoder fail an error check. For instance, as shown in FIG. 5, an error check is performed on hard bits 526 generated by PHY-TD 522. The error check may include a CRC, a parity bit, a checksum, or other error checking/detecting or correcting methods. For example, a 24-bit CRC block may have been appended to a transport block to form a packet in a transmitting device. When the packet is received at a receiving device containing modem architecture 500, PHY-TD 522 decodes the packet and calculates a check value based on the decoded packet. Then the check value is compared to the check value of the CRC block sent from the transmitting device. If the check values do not match, hard bits 526 fail the error check and the packet may be deemed bad.

In step 606, second hard bits and second soft bits are generated by decoding the packet using the second turbo decoder. For example, as shown in FIG. 5, APL-TD 540 decodes the packet received from PHY layer 502 to generate second hard bits 566 and second soft bits 568. Hard bits 526 and soft bits 524 may be generated in an encrypted format.

In step 608, the second hard bits are inserted into a decoded data stream for the source signal in a layer of a protocol stack. For example, as shown in FIG. 5, APL-TD 540 generates hard bits 566, which may be encrypted. In some cases, even if encrypted, hard bits 566 may be inserted into a decoded data stream for the source signal in a layer of protocol stack 554 of modem architecture 500 without having undergone decryption. For example, encrypted hard bits 566 generated by APL-TD 540 may be inserted into PDCP layer 508 or a layer that is lower than PDCP layer 508 in protocol stack 554. This is because PDCP layer 508 already receives encrypted information from RLC layer 506, and therefore can handle hard bits 566 in an encrypted format. Hard bits 566 may be inserted into any selected layer of protocol stack 554 as long as appropriate packet headers for layers lower than the selected layer are removed.

FIG. 7 shows a process that may be incorporated into flowchart 600 to facilitate data decryption, in an embodiment. In step 702, a cipher stream is received that is configured to decrypt and/or encrypt the first hard bits, the first soft bits, the second hard bits, and the second soft bits. For example, as shown in FIG. 5, cipher stream 536 is generated for every frame in PDCP 508 layer to be passed to APL layer 512. Cipher stream 536 is configured to be used to decrypt hard bits (e.g., hard bits 526 and 566) with an exclusive or (XOR) operation at decrypter/encrypter 534, 544, and/or 546. Cipher stream 536 may also be used to decrypt or encrypt soft bits (e.g., soft bits 524 and 568) with a transform function or its inverse at decrypter/encrypter 534, 544, and/or 546.

FIG. 8 shows a flowchart 800 that may be incorporated into flowchart 600 to facilitate insertion of a fixed frame back into a data stream in the protocol stack, according to an example embodiment. Flowchart 800 begins with step 802. In step 802, the second hard bits are decrypted by performing an operation on the cipher stream and the second hard bits. For instance, as shown in FIG. 5, hard bits 566 generated by APL-TD 540 may be decrypted by decrypter/encrypter 546 performing an exclusive or (XOR) operation on second hard bits 566 and cipher stream 536.

In step 804, the decrypted second hard bits are inserted into a decoded data stream for the source signal in a layer of a protocol stack. For example, as shown in FIG. 5, decrypted hard bits 548 may be inserted into a decoded data stream for the source signal in any layer of protocol stack 554 of modem architecture 500, such as RoHC layer 510. The decoded data stream may include a stream of decoded frame(s) of the source signal. In general, decrypted hard bits 548 may be inserted into any selected layer of protocol stack 554 as long as the headers associated with the layers below the selected layer are removed from decrypted hard bits 548 prior to insertion (and the headers for the above layers are included). Furthermore, some layers of protocol stack 554 may receive decrypted hard bits 548, such as layer 510, and some layers of protocol stack 554 may receive decrypted hard bits 548 prior to being decrypted by decrypter/encrypter 546 (i.e., in encrypted form), such as layers 502, 504, 506, or 508. Furthermore, as described above, some layers of protocol stack 554 may have memories that may benefit from a state update as a result of receiving a fixed frame, i.e., decrypted hard bits 548.

FIG. 9 shows a flowchart 900 that may be incorporated into flowchart 600 to facilitate JSCD during each iteration of the APL-TD to decode a received packet of the source signal. Flowchart 900 begins with step 902. In step 902, the second soft bits generated by the second turbo decoder based on the received packet are decrypted. For instance, as shown in FIG. 5, soft bits 568 generated by APL-TD 540 are decrypted using decrypter/encrypter 544 (e.g., according to the inverse transform function described in Equation 2, as described above).

In step 904, the decrypted second soft bits are provided to a PRAB configured to determine extrinsic information. For instance, as shown in FIG. 5, soft bits that have been decrypted by decrypter/encrypter 544 are received at PRAB 542. PRAB 542 receives the decrypted soft bits and using these, along with a priori knowledge, outputs extrinsic information 570. The a priori knowledge may include information that may be exploited in JSCD to improve voice quality of VoLTE.

In step 906, the extrinsic information determined by the PRAB is encrypted. For example, as shown in FIG. 5, extrinsic information 570 generated by PRAB 542 may be encrypted by decrypter/encrypter 544 (e.g., according to the transform function in Equation 1, as described above) to generate encrypted extrinsic information 568.

In step 908, the extrinsic information is received at the second turbo decoder. For instance, as shown in FIG. 5, encrypted extrinsic information is received at APL-TD 540.

Accordingly, decrypter/encrypter 544 performs the decryption and encryption described in flowchart 900 during every iteration of operation of APL-TD 540. This is because APL-TD 540 operates in the encrypted domain on encrypted data (e.g., soft bits) and outputs encrypted data (e.g., hard bits or soft bits), whereas PRAB 542 operates in the decrypted domain to generate decrypted data (e.g., extrinsic information). Therefore, to be able to operate on each other's generated data, decrypter/encrypter 544 decrypts the encrypted soft bits generated by APL-TD 540 for use by PRAB 542, and encrypts the decrypted extrinsic information generated by PRAB 542 for use by APL-TD 540.

Figure 10:
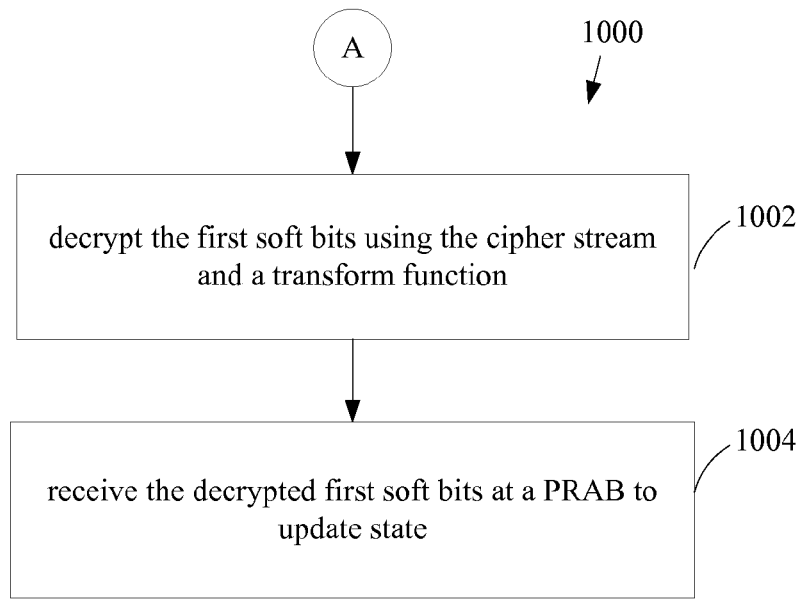
FIGS. 10 and 11 show flowcharts providing processes for handling hard and soft bits for a successfully decoded data packet, according to example embodiments.

FIG. 10 shows a flowchart 1000 of a process that may be incorporated into flowchart 600 in an embodiment. For instance, flowchart 1000 may be performed responsive to a determination that the first hard bits (hard bits 526) generated by PHY-TD 522 for transport block 520 passed the error check at step 604 in flowchart 600 (FIG. 6). In such a situation, APL-TD 540 does not need to decode transport block 520. However, PRAB 542 may receive soft bit information associated with the decoding of transport block 520 as updated state information that may be useful in future decoding operations performed by APL-TD 540. Flowchart 1000 is described as follows.

Flowchart 1000 begins with step 1002. In step 1002, the first soft bits are decrypted using the cipher stream and a transform function. For instance, as shown in FIG. 5, hard bits 526 generated by PHY-TD 522 pass an error check (e.g., CRC) when PHY-TD 522 has successfully decoded a received packet carrying at least one encoded frame of the source signal. In this case, there is no need to use APL-TD 540 to decode the received packet any further or anew. As such, decrypter/encrypter 534 performs the inverse transform function described in Equation 2 on soft bits 524 and cipher stream 536 to decrypt soft bits 524.

In step 1004, the decrypted first soft bits are received at a PRAB to update state. For example, as shown in FIG. 5, the decrypted version of soft bits 524 is received at PRAB 542. The decrypted soft bits are used to update the state of PRAB 542 during a good frame that was successfully decoded by PHY-TD 522. Performance of PRAB 542/APL-TD 540 may be improved with such state updates during the good frames to provide these elements with the latest available information for use in decoding a next bad frame.

Figure 11:
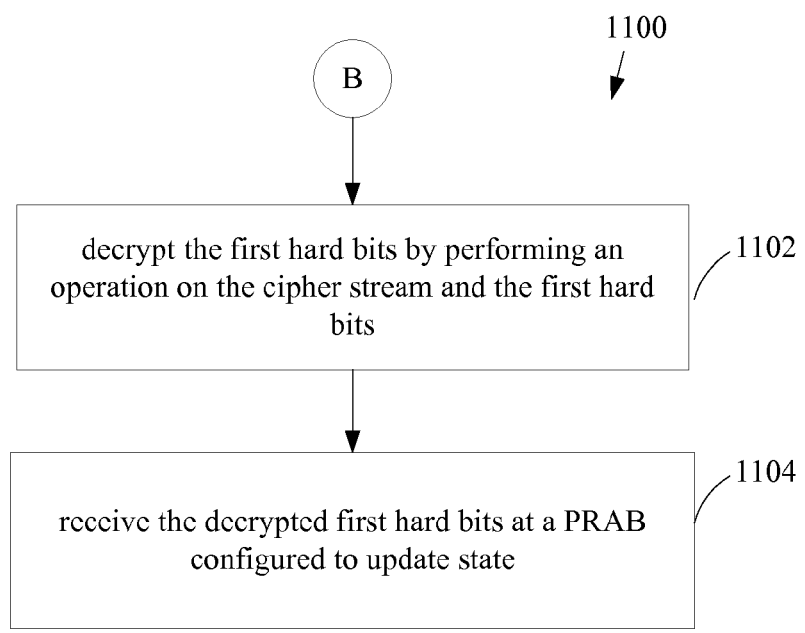

Furthermore, FIG. 11 shows a flowchart 1100 of a process that may be incorporated into flowchart 600 in an embodiment. For instance, similarly to flowchart 1000 described above, flowchart 1100 may be performed responsive to a determination that the first hard bits (hard bits 526) generated by PHY-TD 522 for transport block 520 passed the error check at step 604 in flowchart 600 (FIG. 6). In such a situation, PRAB 542 may receive hard bit information associated with the decoding of transport block 520 as updated state information that may be useful in future decoding operations performed by APL-TD 540. Flowchart 1100 is described as follows.

Flowchart 1100 begins with step 1102. In step 1102, the first hard bits are decrypted by performing an operation on the cipher stream and the first hard bits. For instance, as shown in FIG. 5, hard bits 526 generated by PHY-TD 522 pass an error check (e.g., CRC) when PH-TD 522 has successfully decoded the received packet carrying at least one encoded frame of the source signal. In this case, there is no need to use APL-TD 540 to decode the received packet any further or anew. As such, decrypter/encrypter 534 performs an operation (e.g., XOR) on cipher stream 536 and hard bits 526 to decrypt hard bits 526.

In step 1104, the decrypted first hard bits are received at a PRAB to update state. For example, as shown in FIG. 5, the decrypted version of hard bits 526 is received at PRAB 542. The decrypted hard bits are used to update the state of PRAB 542 during a good frame that was successfully decoded by PHY-TD 522. Performance of PRAB 542/APL-TD 540 may be improved with such state updates during the good frames to provide these elements with the latest available information for use in decoding the next bad frame.

As such, modem architecture 500 may decode incoming data packets using a dual turbo decoder configuration, where a first turbo decoder first decodes an incoming packet, and a second turbo decoder decodes the incoming packet using extrinsic information (generated by a PRAB) if the first turbo decoder receives an error decoding the packet. In FIG. 5, one or more layers of modem architecture 500 are transparent, such that soft bits and/or hard bits may be passed from the physical layer to the application layer. In the embodiments described in the following subsection, modem architectures with dual turbo decoders are provided that decode data packets with less exchange of soft and hard bits between protocol layers as compared to modem architecture 500.

E. Other Examples of a Modem Architecture that Supports JSCD

Figure 12:
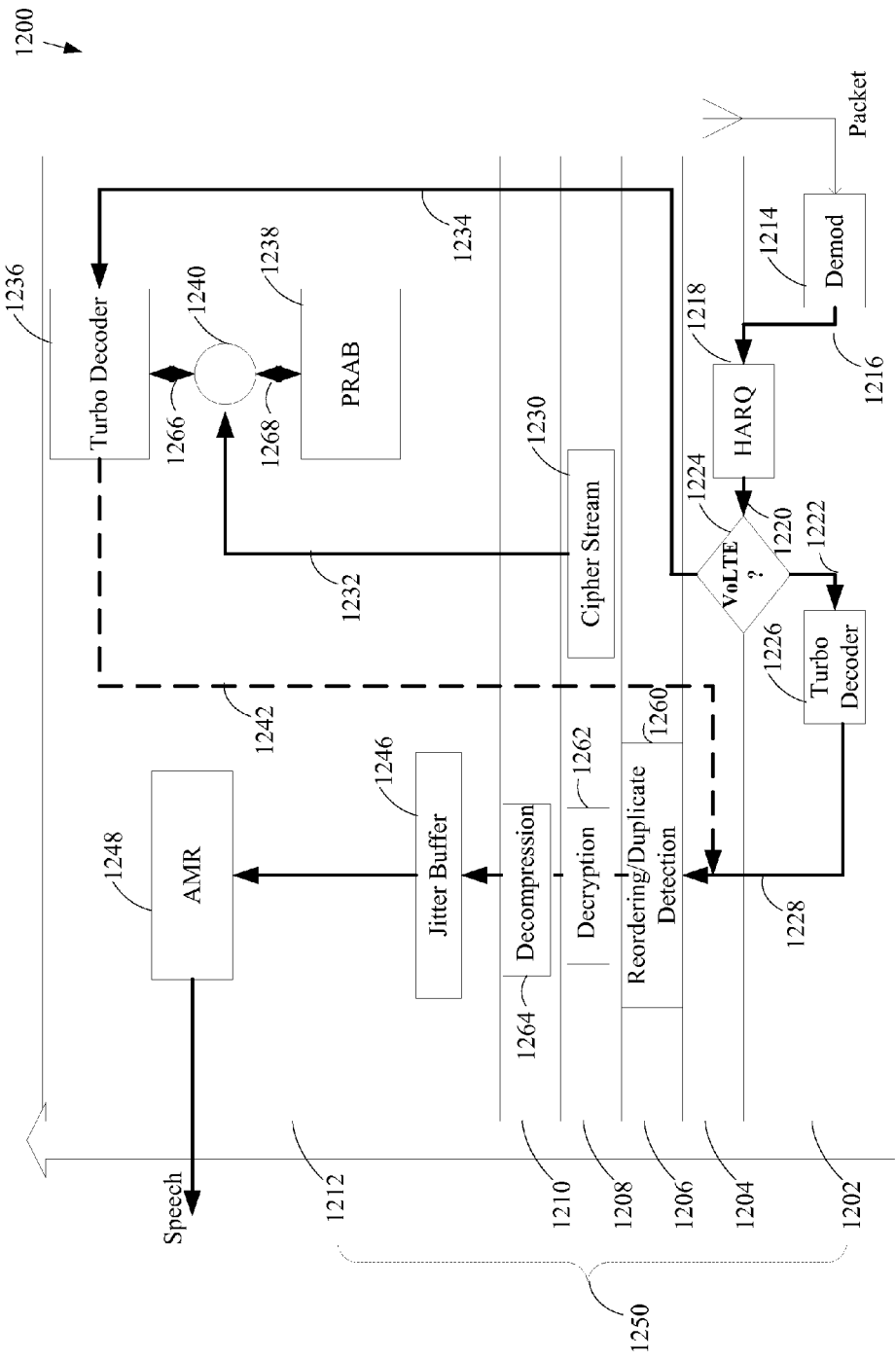
FIG. 12 shows a block diagram of a dual turbo decoder modem architecture that supports JSCD without providing access to soft bits generated by the physical layer turbo decoder, according to an example embodiment.

FIG. 12 shows a modem architecture 1200 that supports JSCD, according to an example embodiment. Similarly to modem architecture 500 shown in FIG. 5, modem architecture 1200 also enables voice quality to be improved in a VoLTE framework by way of incorporating a turbo decoder modified with a packet redundancy analysis block in an application layer of modem architecture 1200. This turbo decoder at the application layer may be configured to operate exclusively on voice data. A difference between modem architecture 500 and modem architecture 1200 is that the turbo decoder in the physical layer of modem architecture 1200 is not used for VoLTE traffic, and thus does not generate any soft bits that may be passed to the turbo decoder in the application layer. This approach enables modem architecture 1200 to be employed in the case where soft bits may not be available or accessible from the turbo decoder at the physical layer. For instance, soft bits from the physical layer turbo decoder may not be available when the physical layer turbo decoder is implemented in custom hardware, or access to the soft bits at the output of the physical layer turbo decoder may be limited or unavailable in some configurations.

As shown in FIG. 1200, modem architecture 1200 includes a protocol stack 1250 that includes a physical (PHY) layer 1202, a MAC layer 1204, an RLC layer 1206, a PDCP layer 1208, a RoHC layer 1210, and an application (APL) layer 1212. PHY layer 1202 includes a demodulator 1214, a HARQ block/buffer 1218, a frame decision block 1224, and a physical layer turbo decoder (PHY-TD) 1226. RLC layer 1206 includes reordering and duplicate detection block 1260. PDCP layer 1208 includes decryption block 1262 and a cipher stream block 1230 that generates a cipher stream 1232. RoHC layer 1210 includes a decompression block 1264. APL layer 1212 includes an application layer turbo decoder (APL-TD) 1236, a packet redundancy analysis block (PRAB) 1238, a decrypter/encrypter 1240, a jitter buffer 1248, and an AMR block 1248. Each element of modem architecture 1200 may be implemented as hardware, or a combination of hardware and software and/or firmware (e.g., an electronic circuit, an application processor, a digital signal processor, a computer program, etc.). For brevity sake, many elements, functions, and concepts related to modem architecture 1200 may be briefly described or not described because these elements, functions, and concepts have been described in connection to modem architecture 500 from FIG. 5 and/or flowchart 600 of FIG. 6. Elements of modem architecture 1200 may be structurally and functionally similar to the corresponding similarly named elements of modem architecture 500, with differences described below.

In an embodiment, a packet, such as packet 402 shown in FIG. 4, is received at an antenna of a receiving device that includes modem architecture 1200, and is routed to demodulator 1214 in PHY layer 1202. The packet may carry one or more encoded frames of a source signal (e.g., voice, video, images, etc.). Demodulator 1214 generates a demodulated packet 1216 by extracting the packet from a modulated carrier wave. Demodulator 1216 may employ any known modulation schemes, such as quadrature phase-shift keying (QPSK) or quadrature amplitude modulation (QAM).

HARQ buffer 1218 receives demodulated packet 1216 from demodulator 1214. In HARQ buffer 1218, demodulated packet 1216 may contain systematic bits, error detection (ED) bits, and a subset of forward error correction (FEC) bits. If the ED bits indicate errors, HARQ buffer 1218 may send one or more requests for retransmission to the device transmitting a data stream that includes the packet. Retransmissions may be combined to create a transport block 1220 that is output from HARQ buffer 1218.

Frame decision block 1224 receives transport block 1220 and determines whether transport block 1220 is VoLTE data. Frame decision block 1224 may be configured to make this decision in various ways, such as by detecting information in one or more headers of transport block 1220 that indicate VoLTE data is contained therein. If transport block 1220 is not VoLTE data, then transport block 1220 is routed to PHY-TD 1226 to be normally processed. However, if transport block 1220 is VoLTE data, then frame decision block 1224 routes transport block 1234 (which may be the same as transport block 1220) to APL layer 1212 for JSCD by APL-TD 1236.

APL-TD 1236 receives transport block 1234, decodes it, and outputs hard bits 1242, which may be inserted into protocol stack 1250 for normal processing. In FIG. 12, hard bits 1242 are inserted into MAC layer 1204, though other layers may instead receive hard bits 1242. Insertion higher in protocol stack 1250 may require removal of lower layer headers. Insertion of hard bits 1242 into RoHC layer 1210 or a higher layer may require hard bits 1242 to be decrypted by a decrypter/encrypter similar to decrypter/encrypter 546 shown in FIG. 5, for example.

APL-TD 1236 operates similarly to APL-TD 540 of FIG. 5 by performing one or more iterations of generating soft bits (based in part on extrinsic information) when attempting to generate hard bits 1242. APL-TD 1236 may output soft bits that are encrypted and receives extrinsic information in an encrypted format when performing JSCD. For every iteration of APL-TD 1236, soft bits 1266 are generated by APL-TD 1236 that may be decrypted by decrypter/encrypter 1240 using cipher stream 1230 and the above described inverse transform function (Equation 2). PRAB 1238 receives the decrypted soft bits from decrypter/encrypter 1240 after decryption. PRAB 1238 uses the received soft bits, along with a priori knowledge, to generate extrinsic information 1268. Extrinsic information 1268 may be encrypted by decrypter/encrypter 1240 using cipher stream 1232 and the above described transform (Equation 1) to generate encrypted extrinsic information. APL-TD 1236 receives the encrypted extrinsic information from decrypter/encrypter 1240. In modem architecture 1200, APL-TD 1236 decodes all VoLTE frames, thus state memory update in PRAB 1238 occurs naturally through soft bits provided to PRAB 1238 (and optionally hard bits 1242).

Figure 13:
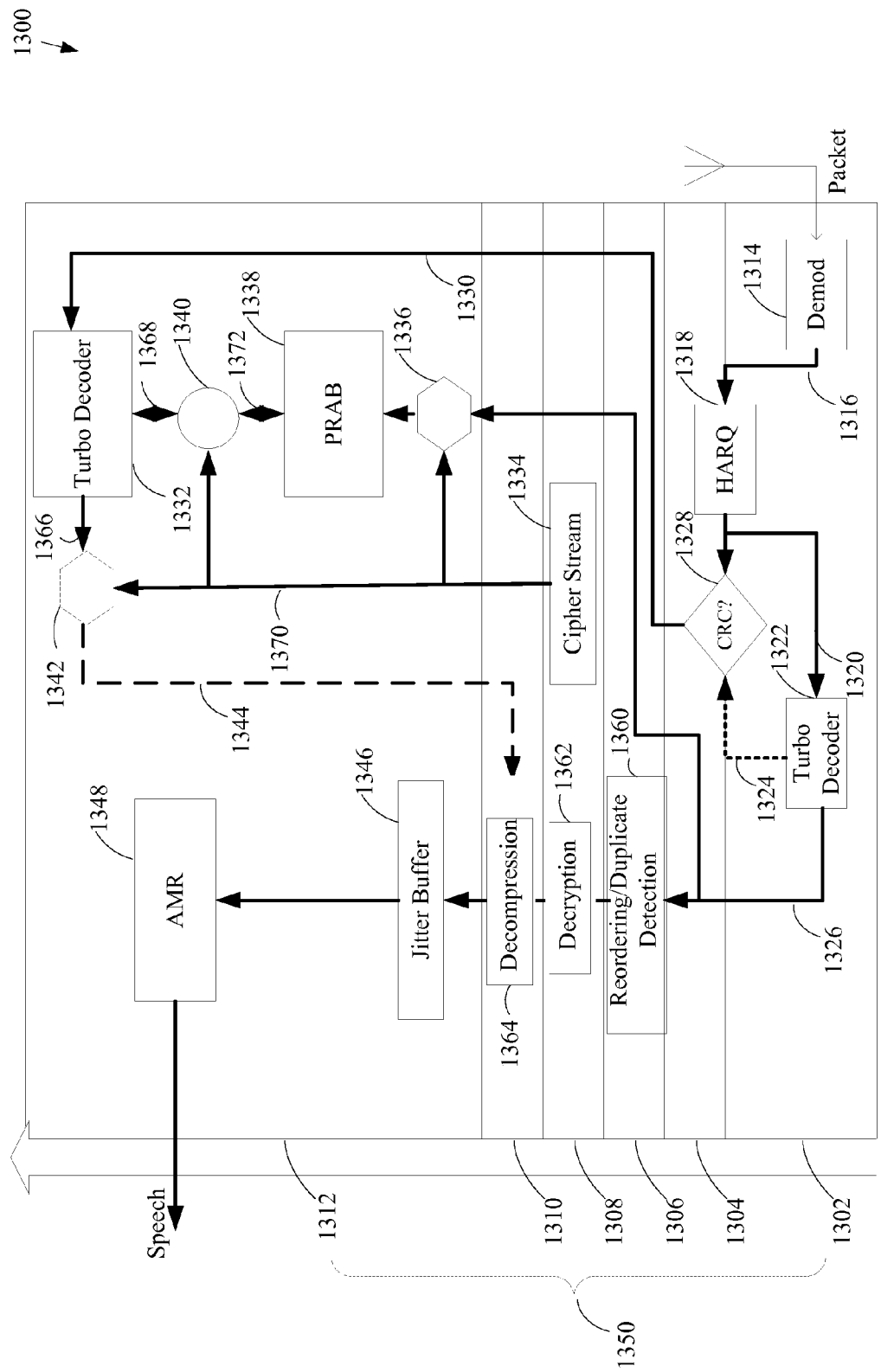
FIG. 13 shows a block diagram of another dual turbo decoder modem architecture that supports JSCD without providing access to soft bits generated by the physical layer turbo decoder, according to an example embodiment.

According to another example embodiment, FIG. 13 shows a modem architecture 1300 that supports JSCD. Similar to modem architecture 1200 shown in FIG. 12, modem architecture 1300 also enables voice quality to be improved in a VoLTE framework and is suitable when soft bits are not available from the turbo decoder in the physical layer. Modem architecture 1300 includes a turbo decoder modified with a packet redundancy analysis block in an application layer of modem architecture 1300. This turbo decoder at the application layer may be configured to operate exclusively on voice data.

As shown in FIG. 1300, modem architecture 1300 includes a protocol stack 1350 that includes a physical (PHY) layer 1302, a MAC layer 1304, an RLC layer 1306, a PDCP layer 1308, a RoHC layer 1310, and an application (APL) layer 1312. PHY layer 1302 includes a demodulator 1314, a HARQ block/buffer 1318, a physical layer turbo decoder (PHY-TD) 1322, and a frame decision block 1328. RLC layer 1306 includes reordering and duplicate detection block 1360. PDCP layer 1308 includes decryption block 1362 and a cipher stream block 1334 that generates a cipher stream 1370. RoHC layer 1310 includes a decompression block 1364. APL layer 1312 includes an application layer turbo decoder (APL-TD) 1332, a first decrypter/encrypter 1336, a packet redundancy analysis block (PRAB) 1338, a second decrypter/encrypter 1340, a third decrypter/encrypter 1342, a jitter buffer 1346, and an AMR block 1348. Each element of modem architecture 1300 may be implemented as hardware, or a combination of hardware and software and/or firmware (e.g., an electronic circuit, an application processor, a digital signal processor, a computer program, etc.). For brevity sake, many elements, functions, and concepts related to modem architecture 1300 may be briefly described or not described because these elements, functions, and concepts have been described in connection to modem architecture 500 from FIG. 5 and/or flowchart 600 of FIG. 6. Elements of modem architecture 1300 may be structurally and functionally similar to the corresponding similarly named elements of modem architecture 500, with differences described below.

In an embodiment, a packet, such as packet 402 shown in FIG. 4, is received at an antenna of a receiving device and is routed to demodulator 1314 in PHY layer 1302. The packet may carry an encoded frame of a source signal (e.g., voice, video, images). Demodulator 1314 generates a demodulated packet 1316 by extracting the packet from a modulated carrier wave. Demodulator 1316 may employ any known modulation schemes, such as quadrature phase-shift keying (QPSK) or quadrature amplitude modulation (QAM).

HARQ buffer 1318 receives demodulated packet 1316 from demodulator 1314. In HARQ buffer 1318, demodulated packet 1316 may contain systematic bits, error detection (ED) bits, and a subset of forward error correction (FEC) bits. If the ED bits indicate errors, HARQ buffer 1318 may send one or more requests for retransmission to the device transmitting a data stream that includes the packet. Retransmissions may be combined to create a transport block 1320 that is output from HARQ buffer 1318.

PHY-TD 1322 receives transport block 1320 from HARQ buffer 1318. PHY-TD 1322 generates hard bits 1326, which may be encrypted. Hard bits 1326 are passed up protocol stack 1352 for normal processing. Hard bits 1326 are further passed to decrypter/encrypter 1336, which generates a decrypted form of hard bits 1326 by performing an operation (e.g., XOR) on hard bits 1326 and cipher stream 1334. The decrypted version of hard bits 1326 is received by PRAB 1338 for state update, as described above.

A bad frame is detected if hard bits 1326 fail an error check (e.g., CRC) at PHY-TD 1322. Frame decision block 1328 receives frame indicator 1324 generated by PHY-TD 1322, which may indicate whether the current frame is a good frame or a bad frame. Upon determining that the current frame is a bad frame, frame decision block 1328 may indicate that transport block 1320 should be passed to APL layer 1332 for JSCD processing by APL-TD 1332. In an embodiment, HARQ 1318 passes transport block 1320 to APL-TD 1332 for further processing as transport block 1330.

APL-TD 1332 receives transport block 1330, decodes it, and outputs hard bits 1366, which may be inserted into protocol stack 1350 for normal processing. In FIG. 13, hard bits 1366 generated by APL-TD 1332 are decrypted by decrypter/encrypter 1342. For instance, decrypter/encrypter 1342 may decrypt hard bits 1366 by performing an operation (e.g., XOR) on hard bits 1366 and cipher stream 1334. Decrypter/encrypter 1342 outputs decrypted hard bits 1344. Decrypted hard bits 1344 may be inserted into protocol stack 1350 at RoHC layer 1310 as depicted in FIG. 13, or at another layer as described above. For instance, insertion higher in protocol stack 1350 may require removal of lower layer headers. In some layers, hard bits 1366 (encrypted) may be inserted into the data stream rather than decrypted hard bits 1344.

APL-TD 1332 operates similarly to APL-TD 540 of FIG. 5 by performing one or more iterations of generating soft bits (based in part on extrinsic information) when attempting to generate hard bits 1366. APL-TD 1332 outputs soft bits that are encrypted and receives extrinsic information in an encrypted format when performing JSCD. For every iteration of APL-TD 1332, soft bits 1368 are generated by APL-TD 1332, and may be decrypted by decrypter/encrypter 1340 using cipher stream 1334 and the above described inverse transform function (Equation 2). PRAB 1338 receives the decrypted version of soft bits 1368 from decrypter/encrypter 1340. PRAB 1338 uses the received soft bits, along with a priori knowledge, to generate extrinsic information 1372. Extrinsic information 1372 may be encrypted by decrypter/encrypter 1340 using cipher stream 1334 and the above described transform function (Equation 1). APL-TD 1332 receives the encrypted extrinsic information from decrypter/encrypter 1340.

E. Example Computer Embodiments

Modem architecture 500 (and the layers thereof), demodulator 514, HARQ block/buffer 518, PHY-TD 522, cipher stream block 528, frame decision block 530, decrypters/encrypters 534, 544, 546, APL-TD 540, PRAB 542, jitter buffer 550, AMR block 552, reordering and duplicate detection block 560, decryption block 562, decompression block 564, modem architecture 1200 (and the layers thereof), demodulator 1214, HARQ block/buffer 1218, PHY-TD 1226, cipher stream 1230, frame decision block 1224, APL-TD 1236, PRAB 1238, jitter buffer 1246, AMR block 1248, reordering and duplicate detection block 1260, decryption block 1262, decompression block 1264, modem architecture 1300 (and the layers thereof), demodulator 1314, HARQ block/buffer 1318, PHY-TD 1322, cipher stream 1334, frame decision block 1328, APL-TD 1332, PRAB 1338, decrypter/encrypter 1342, jitter buffer 1346, AMR block 1348, reordering and duplicate detection block 1360, decryption block 1362, decompression block 1364, flowchart 600, step 702, flowchart 800, flowchart 900, flowchart 1000, flowchart 1100, and/or any further systems, sub-systems, and/or components disclosed herein may be implemented in hardware (e.g., hardware logic/electrical circuitry), or any combination of hardware with software (computer program code configured to be executed in one or more processors or processing devices) and/or firmware.

Figure 14:
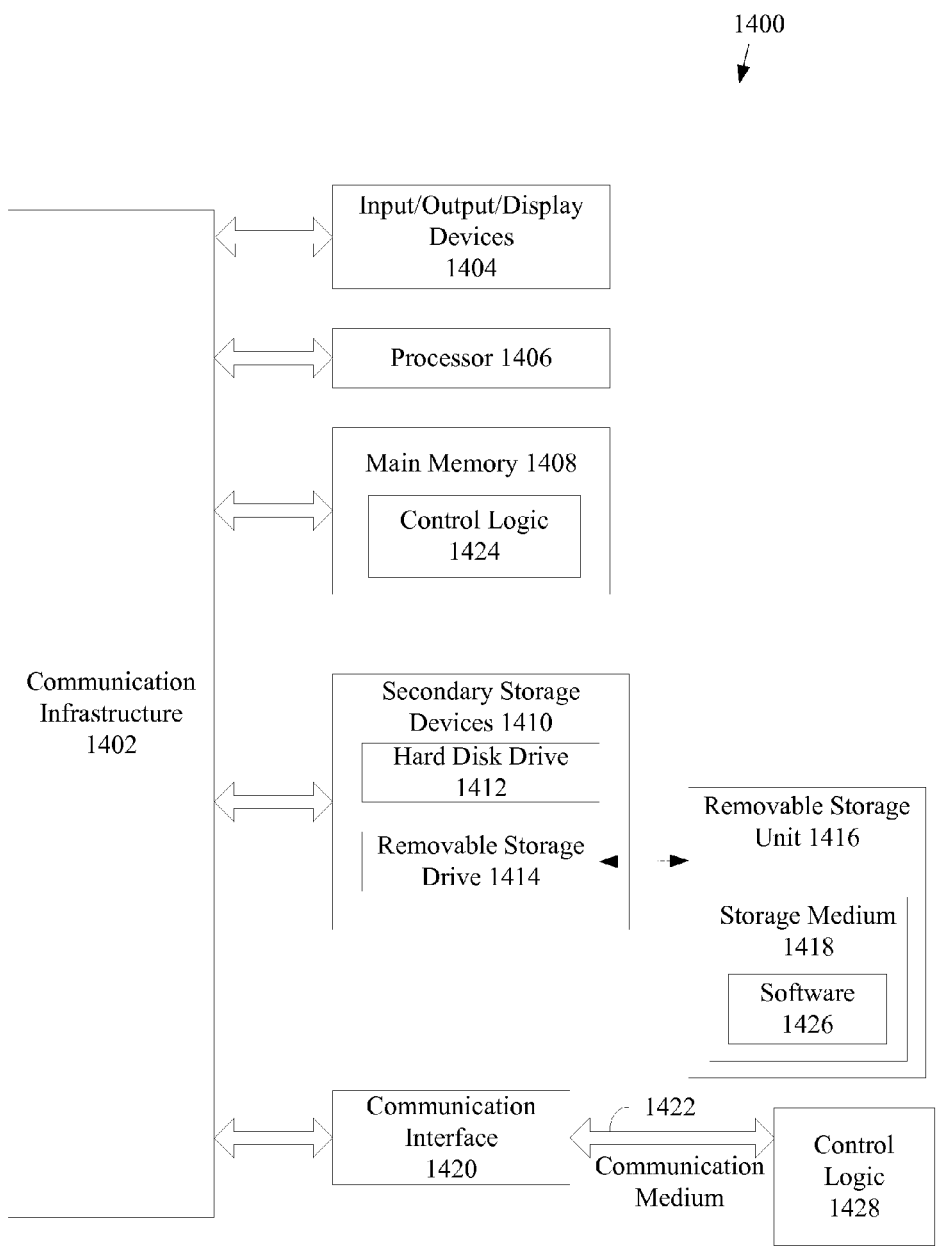
FIG. 14 is a block diagram of a computer system, according to an exemplary embodiment.

The embodiments described herein, including systems, methods/processes, and/or apparatuses, may be implemented using well-known processing devices, telephones (smart phones and/or mobile phones), servers, and/or computers, such as computer 1400 shown in FIG. 14. It should be noted that computer 1400 may represent communication devices, processing devices, and/or traditional computers in one or more embodiments. For example, modem architectures 500, 1200, and 1300 and any of the sub-systems or components respectively contained therein may be implemented using one or more computers 1400.

Computer 1400 can be any commercially available and well-known communication device, processing device, and/or computer capable of performing the functions described herein, such as devices/computers available from International Business Machines®, Apple®, Sun®, HP®, Dell®, Cray®, Samsung®, Nokia®, etc. Computer 500 may be any type of computer, including a desktop computer, a mobile device (e.g., a smart phone, a laptop, a netbook, a tablet computer, etc.), a server, etc.

Computer 1400 includes one or more processors (also called central processing units or CPUs), such as processor 1406. Processor 1406 is connected to a communication infrastructure 1402, such as a communication bus. In some embodiments, processor 1406 can simultaneously operate multiple computing threads.

Computer 1400 also includes a primary or main memory 1408, such as random access memory (RAM). Main memory 1408 has stored therein control logic 1424 (computer software), and data.

Computer 1400 also includes one or more secondary storage devices 1410, including, for example, a hard disk drive 1412 and/or a removable storage device or drive 1414. Computer 1400 may also include other types of storage devices, such as memory cards and memory sticks. For instance, computer 1400 may include an industry standard interface, such as a universal bus (USB) interface for interfacing with devices such as a memory stick. Removable storage drive 1414 represents a floppy disk drive, a magnetic tape drive, a compact disk drive, an optical storage device, tape backup, etc.

Removable storage drive 1416 interacts with a removable storage unit 1416. Removable storage unit 1416 includes a computer useable or readable storage medium 1418 having stored therein computer software 1426 (control logic) and/or data. Removable storage unit 1416 represents a floppy disk, magnetic tape, compact disk, DVD, optical storage disk, or any other computer data storage device. Removable storage drive 1414 reads from and/or writes to removable storage unit 1416 in a well-known manner.

Computer 1400 also includes input/output/display devices 1404, such as touchscreens, LED and LCD displays, monitors, keyboards, pointing devices, etc.

Computer 1400 further includes a communication or network interface 1420. Communication interface 1420 enables computer 1400 to communicate with remote devices. For example, communication interface 1420 allows computer 1400 to communicate over communication networks or medium 1422 (representing a form of a computer usable or readable medium), such as LANs, WANs, the Internet, etc. Network interface 1420 may interface with remote sites or networks via wired or wireless connections.

Control logic 1428 may be transmitted to and from computer 1400 via communication medium 1422.

Any apparatus or manufacture comprising a computer usable or readable medium having control logic (software) stored therein is referred to herein as a computer program product or program storage device. This includes, but is not limited to, computer 1400, main memory 1408, secondary storage devices 1410, and removable storage unit 1416. Such computer program products, having control logic stored therein that, when executed by one or more data processing devices to operate as described herein, represent embodiments.

Devices in which embodiments may be implemented may include storage, such as storage devices, memory devices, and further types of computer-readable media. Examples of such computer-readable storage media include a hard disk, a removable magnetic disk, a removable optical disk, flash memory cards, digital video disks, random access memories (RAMs), read only memories (ROM), and the like. As used herein, the terms "computer program medium" and "computer-readable medium" are used to generally refer to the hard disk associated with a hard disk drive, a removable magnetic disk, a removable optical disk (E.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable storage media may store program modules that include computer program logic to implement, for example, modem architecture 500 (and the layers thereof), demodulator 514, HARQ block/buffer 518, PHY-TD 522, cipher stream block 528, frame decision block 530, decrypters/encrypters 534, 544, 546, APL-TD 540, PRAB 542, jitter buffer 550, AMR block 552, reordering and duplicate detection block 560, decryption block 562, decompression block 564, modem architecture 1200 (and the layers thereof), demodulator 1214, HARQ block/buffer 1218, PHY-TD 1226, cipher stream 1230, frame decision block 1224, APL-TD 1236, PRAB 1238, jitter buffer 1246, AMR block 1248, reordering and duplicate detection block 1260, decryption block 1262, decompression block 1264, modem architecture 1300 (and the layers thereof), demodulator 1314, HARQ block/buffer 1318, PHY-TD 1322, cipher stream 1334, frame decision block 1328, APL-TD 1332, PRAB 1338, decrypter/encrypter 1342, jitter buffer 1346, AMR block 1348, reordering and duplicate detection block 1360, decryption block 1362, decompression block 1364, flowchart 600, step 702, flowchart 800, flowchart 900, flowchart 1000, flowchart 1100 (including any one or more steps of flowcharts 600, 800, 900, 1000, and 1100), and/or further embodiments described herein. Embodiments are directed to computer program products comprising such logic (e.g., in the form of program code, instructions, or software) stored on any computer useable medium. Such program code, when executed in one or more processors, causes a device to operate as described herein.

Note that such computer-readable storage media are distinguished from and non-overlapping with communication media (do not include communication media). Communication media typically embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media. Embodiments are also directed to such communication media.

F. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for decoding a source signal, comprising:
generating first hard bits and first soft bits by decoding a packet carrying at least one encoded frame of the source signal using a first turbo decoder; and
responsive to a determination that the first hard bits generated by the first turbo decoder fail an error check, generating second hard bits and second soft bits by decoding the packet using a second turbo decoder;
wherein the generated first hard bits and the generated second hard bits indicate respective decoding decisions for the encoded frame, the generated first soft bits indicate a reliability of the generated first hard bits, and the generated second soft bits indicate a reliability of the generated second hard bits.

2. The method of claim 1, further comprising:
receiving a cipher stream configured to decrypt and/or encrypt at least one of the first hard bits, the first soft bits, the second hard bits, or the second soft bits.

3. The method of claim 2, further comprising:
decrypting the second hard bits by performing an operation on the cipher stream and the second hard bits; and
inserting the decrypted second hard bits into a decoded data stream for the source signal in a layer of a protocol stack.

4. The method of claim 2, further comprising:
responsive to a determination that the first hard bits pass the error check:
  decrypting the first soft bits using the cipher stream and a transform function; and
  receiving the decrypted first soft bits at a packet redundancy analysis block (PRAB) to update state.

5. The method of claim 2, further comprising:
responsive to a determination that the first hard bits pass the error check:
  decrypting the first hard bits by performing an operation on the cipher stream and the first hard bits; and
  receiving the decrypted first hard bits at a packet redundancy analysis block (PRAB) to update state.

6. The method of claim 1, further comprising:
for each iteration of operation of the second turbo decoder to decode a received packet of the source signal,
  decrypting the second soft bits generated by the second turbo decoder based on the received packet;
  providing the decrypted second soft bits to a packet redundancy analysis block (PRAB) configured to determine extrinsic information;
  encrypting the extrinsic information determined by the PRAB; and
  receiving the encrypted extrinsic information at the second turbo decoder.

7. The method of claim 1, further comprising:
inserting the second hard bits into a decoded data stream for the source signal in a layer of a protocol stack.

8. A modem, comprising:
a first turbo decoder configured to generate first hard bits and first soft bits by decoding a packet carrying at least one encoded frame of a source signal; and
a second turbo decoder configured to generate second hard bits and second soft bits by decoding the packet responsive to a determination that the first hard bits generated by the first turbo decoder fail an error check;
wherein the generated first hard bits and the generated second hard bits indicate respective decoding decisions for the encoded frame, the generated first soft bits indicate a reliability of the generated first hard bits, and the generated second soft bits indicate a reliability of the generated second hard bits.

9. The modem of claim 8, further comprising:
a cipher stream configured to decrypt and/or encrypt at least one of the first hard bits, the first soft bits, the second hard bits, or the second soft bits.

10. The modem of claim 9, further comprising:
a decrypter/encrypter configured to decrypt the second hard bits by performing an operation on the cipher stream and the second hard bits; and
wherein the decrypted second hard bits are inserted into a decoded data stream for the source signal in a layer of a protocol stack.

11. The modem of claim 9, further comprising:
a first decrypter/encrypter configured to decrypt at least one of the first soft bits or the second soft bits using a cipher stream and a transform function;
a second decrypter/encrypter configured to decrypt at least one of the first hard bits or the second hard bits by performing an operation on the cipher stream and a corresponding one of the first hard bits or the second hard bits; and
a packet redundancy analysis block (PRAB) configured to receive one or more of decrypted first soft bits, decrypted second soft bits, or decrypted first hard bits, and to determine extrinsic information.

12. The modem of claim 11, wherein for each iteration of operation of the second turbo decoder to decode a received packet of the source signal,
the first decrypter/encrypter is configured to decrypt the second soft bits generated by the second turbo decoder based on the received packet;
the PRAB is configured to determine extrinsic information based at least on a priori knowledge of the source signal;
the first decrypter/encrypter is configured to encrypt the extrinsic information; and
the second turbo decoder is configured to receive the encrypted extrinsic information.

13. The modem of claim 8, wherein the first turbo decoder is in a physical layer of the modem, and the second turbo decoder is in an application layer of the modem.

14. A system that supports joint source channel decoding, comprising:
a first turbo decoder; and
a second turbo decoder configured to generate second hard bits and second soft bits by decoding a packet carrying at least one encoded frame of a source signal in response to a determination that first hard bits generated by the first turbo decoder fail an error check;
wherein the second hard bits indicate decoding decisions for the encoded frame, and the second soft bits indicate a reliability of the second hard bits.

15. The system of claim 14, further comprising:
a cipher stream configured to at least enable the second hard bits and the second soft bits to be decrypted.

16. The system of claim 14, wherein the second turbo decoder is further configured to decode the packet only in response to a determination that the source signal contains voice data.

17. The system of claim 14, wherein the first turbo decoder is in a physical layer of a modem, and the second turbo decoder is in an application layer of the modem, and the first turbo decoder is configured to generate the first hard bits and first soft bits by decoding the packet, the first soft bits not being available to the second turbo decoder in the application layer; and wherein the second turbo decoder is configured to receive the packet from a buffer in the physical layer.

18. The system of claim 17, further comprising:

a packet redundancy analysis block (PRAB) configured to receive the first hard bits responsive to a determination that the first hard bits pass the error check.

19. The system of claim 15, further comprising:

a decrypter/encrypter configured to decrypt and encrypt at least the second soft bits and extrinsic information using the cipher stream and a transform function for each iteration of operation of the second turbo decoder; and a packet redundancy analysis block (PRAB) configured to receive the second soft bits, and to determine the extrinsic information based at least on a priori knowledge of the source signal for each iteration of operation of the second turbo decoder;

wherein the second turbo decoder is configured to receive the extrinsic information in an encrypted format for each iteration of operation.

20. The system of claim 15, further comprising:

a decrypter/encrypter configured to decrypt at least the second hard bits to generatea decrypted format of the second hard bits based on the cipher stream;

wherein the second hard bits are inserted into a decoded data stream for the source signal in the encrypted format or the decrypted format.

\* \* \* \* \*